(12) United States Patent
Shah

(10) Patent No.: US 11,079,091 B2
(45) Date of Patent: Aug. 3, 2021

(54) LENS AND METHOD OF PRODUCING A LENS

(71) Applicant: SMR Patents S.à.r.l., Luxembourg (LU)

(72) Inventor: Nitesh Shah, Stuttgart (DE)

(73) Assignee: SMR Patents S.à.r.l., Luxembourg (LU)

( * ) Notice: Subject to any disclaimer, the term of this patent is extended or adjusted under 35 U.S.C. 154(b) by 110 days.

(21) Appl. No.: 16/301,963

(22) PCT Filed: May 18, 2017

(86) PCT No.: PCT/EP2017/062011
§ 371 (c)(1),
(2) Date: Nov. 15, 2018

(87) PCT Pub. No.: WO2017/198781
PCT Pub. Date: Nov. 23, 2017

(65) Prior Publication Data
US 2019/0162389 A1 May 30, 2019

(30) Foreign Application Priority Data

May 18, 2016 (DE) ..................... 10 2016 109 159.6

(51) Int. Cl.
*F21V 7/00* (2006.01)
*F21V 5/04* (2006.01)
(Continued)

(52) U.S. Cl.
CPC ............ *F21V 7/0091* (2013.01); *F21S 43/14* (2018.01); *F21S 43/26* (2018.01); *F21S 43/315* (2018.01);
(Continued)

(58) Field of Classification Search
CPC . G02B 3/00; G02B 1/041; G02B 1/04; G02B 13/0085; G02B 7/02;
(Continued)

(56) References Cited

U.S. PATENT DOCUMENTS

| 2,254,962 A | 9/1941 | Harris et al. |
| 6,075,650 A * | 6/2000 | Morris ................... G02B 27/09 359/641 |

(Continued)

FOREIGN PATENT DOCUMENTS

DE 60033639 T2 11/2007

OTHER PUBLICATIONS

German Office Action dated Mar. 17, 2017 of German application No. 10 2016 109 159.6.
(Continued)

*Primary Examiner* — Ricky L Mack
*Assistant Examiner* — Sharrief I Broome
(74) *Attorney, Agent, or Firm* — Jones Day

(57) ABSTRACT

A lens includes a first interface acting as a refractive entrance surface for a light ray, a second interface acting as a total inner reflective (TIR) surface for the light ray entering the lens through the first interface, and a third interface acting as a refractive exit surface for the light ray reflected at the second interface. A method of producing a lens includes shaping the second interface and the third interface so that at least two light rays having a diverging angle to each other and impinging under an arbitrary solid angle onto the first interface exit the lens in the area of the third interface substantial parallel to each other and in a common direction of space.

13 Claims, 21 Drawing Sheets

(51) Int. Cl.

| | |
|---|---|
| *F21S 43/14* | (2018.01) |
| *F21S 43/31* | (2018.01) |
| *G02B 19/00* | (2006.01) |
| *F21V 5/00* | (2018.01) |
| *F21S 43/20* | (2018.01) |
| *G02B 6/42* | (2006.01) |
| *H01L 33/60* | (2010.01) |
| *F21Y 115/10* | (2016.01) |

(52) U.S. Cl.
CPC ............... *F21V 5/007* (2013.01); *F21V 5/04* (2013.01); *G02B 6/4206* (2013.01); *G02B 19/0028* (2013.01); *G02B 19/0052* (2013.01); *H01L 33/60* (2013.01); *F21Y 2115/10* (2016.08)

(58) Field of Classification Search
CPC .. G02B 19/0061; G02B 1/002; G02B 3/0012; G02B 7/022; G02B 7/025; G02B 1/043; G02B 13/004; G02B 19/0014; G02B 19/0028; G02B 1/10; G02B 1/14; G02B 2207/101; G02B 3/0037; G02B 13/0045; G02B 27/0025; B29D 11/00009; B29D 11/0073; B29D 11/0048; B29D 11/00365; B29D 11/00278; B29D 11/00307; B29D 11/00317; B29D 11/00346; B29D 11/00413; B29D 11/00432; B29D 11/00442; B29D 11/00192; B29D 11/00375; B29D 11/00403; B29D 11/00451; B29D 11/00634; B29D 11/0074; B29D 11/00865; H01L 2924/00; H01L 2924/0002; H01L 2224/48091; H01L 27/14618; H01L 27/14625; H01L 27/14685; H01L 2924/12042; H01L 31/0543; H01L 27/14627; H01L 2924/00014; H01L 31/02325; H01L 31/0547; H01L 33/54; H01L 2224/04042; H01L 2224/48464; H01L 24/05; H01L 27/146; H01L 27/14623; H01L 27/14632; H01L 27/14687; Y10T 428/24355; Y10T 156/10; Y10T 156/1052; Y10T 428/24479; Y10T 428/24612; Y10T 428/24802; Y10T 428/2481; Y10T 428/24917; Y10T 156/1056; Y10T 29/49826; Y10T 428/24273; Y10T 428/24322; Y10T 428/24331; Y10T 428/249921; Y10T 428/265; Y10T 428/2929; Y10T 428/31504; Y10T 428/3154; Y10T 83/04; Y10T 83/0524; B29C 45/16; B29C 45/2708; B29C 45/34; B29C 2035/0811; B29C 2045/0094; B29C 2045/14942; B29C 2045/2683; B29C 2791/008; B29C 45/0025; B29C 45/14; B29C 45/14016; B29C 45/1634; B29C 45/1671; B29C 45/27; B29C 45/568; B29C 45/73; B29C 2045/0027; B29C 2045/0058; B29C 2045/2714; B29C 2045/5635; H01S 5/183; H01S 5/423; H01S 3/005; H01S 3/0612; H01S 3/0627; H01S 3/094053; H01S 3/09415; H01S 3/113; H01S 3/1611; H01S 3/1643; H01S 5/02284; H01S 5/02288; H01S 5/18361; H01S 2301/166; H01S 3/025; H01S 3/06708; H01S 3/08059; H01S 3/094049; H01S 3/1022; H01S 3/106; B32B 2551/00; B32B 3/10; B32B 15/08; B32B 1/00; B32B 2037/1253; B32B 2250/02; B32B 2255/10; B32B 2255/26; B32B 2307/732; B32B 2309/02; B32B 2309/12; B32B 2333/12; B32B 2367/00; B32B 2379/08; B32B 27/08; B32B 27/281; B32B 27/285; B32B 27/308; B32B 27/32; B32B 27/34
See application file for complete search history.

(56) References Cited

U.S. PATENT DOCUMENTS

| | | | |
|---|---|---|---|
| 6,547,423 B2 | 4/2003 | Marshall et al. | |
| 2003/0016539 A1* | 1/2003 | Minano | F24S 23/00 362/347 |
| 2006/0202909 A1* | 9/2006 | Nagai | H01Q 15/08 343/911 R |
| 2008/0130309 A1* | 6/2008 | Condon | F21V 5/08 362/520 |
| 2009/0128921 A1* | 5/2009 | Roth | G02B 19/0028 359/641 |
| 2009/0225552 A1* | 9/2009 | Chen | G02B 19/0052 362/333 |
| 2010/0039830 A1 | 2/2010 | Cheung et al. | |
| 2015/0070901 A1* | 3/2015 | Rich | F21K 9/60 362/311.01 |

OTHER PUBLICATIONS

International Search Report dated Aug. 4, 2017 of International application No. PCT/EP2017/062011.
Written Opinion dated Aug. 4, 2017 of International application No. PCT/EP2017/062011.

* cited by examiner (State of the art)

LENS AND METHOD OF PRODUCING A LENS

CROSS-REFERENCE TO RELATED APPLICATIONS

This application is a National Stage Entry of International Patent Application No. PCT/EP2017/062011, filed May 18, 2017, which claims the benefit of priority to German Patent Application No. DE 10 2016 109 159.6, filed May 18, 2016, each of which is incorporated by reference herein in its entirety for all purposes.

BACKGROUND OF THE INVENTION

1. Field of the Invention

The following description relates to a lens including at least one first interface acting as a refractive entrance surface for at least one light ray, at least one second interface acting as a total inner reflective (TIR) surface for the light ray entering the lens through the first interface, and at least one third interface acting as an refractive exit surface for the light ray reflected at the second interface as well as a method of producing a lens.

2. Related Art

Conventional lenses are used in lens systems for lighting modules in vehicle mirrors for collimation of light rays emitted by a light emitting source and/or uniform illumination of a target area with controlled overall size of the lens based on the design need.

Lenses for collimation of light rays are known from the state of the art. For example US 2002/0080615 A1 describes such a lens in form of a LED collimation optics with improved performance and reduced size. The collimator lens has an inner refractive wall, an outer reflective wall, a first surface having an entrance aperture with a recess in which the LED is situated and which collimator lens is also provided with a second surface from which light generated by the LED emerges. Thereby, the outer reflective wall is configured in accordance with the structure of the inner refractive wall to achieve substantial collimation of a source of light at the entrance aperture.

However, a conventional lens provides less degrees of freedom for achieving intended design, illumination and collimation. As a consequence, there is a reduced control on individual lens parameters, such the overall length size and the overall lighting distribution under given collimation requirements and vice versa. Furthermore, the lens known from the state of the art have disadvantages in the fabrication process and for utilisation within a housing.

SUMMARY

In one aspect, a lens includes a second interface and a third interface which are shaped such that at least two light rays having a diverging angle to each other and impinging under an arbitrary solid angle onto a first interface, exit the lens in the area of the third interface substantial parallel to each other and in a common direction of space, the third interface being shaped such that it has at least area by area a normal vector neither parallel nor perpendicular to a direction of space, and the at least two light rays are substantial non-parallel to each other until exiting the third surface.

The light rays may exit the lens under at least one first solid angle.

The lens, in particular in a first plane perpendicular to the first solid angle, may include a substantial rectangular, quadratic, circular, elliptical and/or polinomial periphery, wherein preferably at least one light emitting source which emit(s) the light rays can be placed at the center of gravity of the first plane.

At least one fourth interface may include at least one contact area for at least one mounting element, especially for mounting the lens to at least one supporting structure.

The lens may include at least area by area, in particular in the area of the first interface, the second interface and/or the third interface, at least one first medium, preferably comprising PMMA, PC and/or glass, and/or the first interface, the second interface and/or the third interface may include a transition between a second medium, especially comprising air and/or a low refractive index medium on the one hand and the second medium on the other hand.

The shape of at least one first section of the second interface can be described by a polynomial first function, where the first function describes in particular the angle of reflection of the light ray reflected at the first section of the second interface in dependency of a first incident angle of the light ray on the first interface.

In another aspect, a method for producing a lens, in particular an inventive lens, includes defining an optical axis of the lens as a symmetry axis, which passes through a first plane, in which first plane at least one propagation path of at least one light ray emitted by at least one light emitting source passes, the lens includes at least one first interface acting as an refractive entrance surface for the light ray, at least one second interface acting as a total inner reflective (TIR) surface for the light ray entering the lens through the first interface, and at least one third interface acting as an refractive exit surface for the light ray reflected at the second interface, where at a plurality of points of at least one first section of the second interface the angle of reflection with respect to the optical axis of the light ray impinging on the second interface is described by at least one polynomial first function in dependency of at least one first variable.

The first variable may be determined in dependency on a first angle, by which angle the angle of incident under which the light ray impinges on the first interface with respect to the optical axis is described.

The angle of reflection may be determined for at least one value which value exceeds at least one first limit of the first value and/or for at least one value which value falls below of at least one second limit of the first value.

A plurality of points of at least one second section of the second interface the angle of reflection of the light ray impinging on the second interface with respect to the optical axis may be described by at least one polynomial second function in dependency on at least the first variable.

A plurality of second functions may be determined for a plurality of second sections, in particular for one second section, two, three, four, five, six, seven, eight, nine, ten second sections.

The first interface, especially the form of the first interface, may be described at least area by area, in particular the area by area course in the first plane by a polynomial third function.

The first function, the second function and/or the third function may be determined by at least one polynomial function of order one, two, three, five, six, seven, eight, nine and/or ten.

The third interface, especially the form of the third interface may be calculated at least area by area, in particular the area by area course in the first plane, by means of the cartesian oval method, tangent approximation method, partial differential equation based method and/or any other design method.

The first interface, the second interface and/or the third interface, especially the form of the first interface, the second interface and/or the third interface, may be determined for a plurality of first planes arranged under different second angles relatively to the symmetry axis and/or the optical axis.

The first function, the second function and/or the third function may be determined in dependency on the second angle, in particular the first function, the second function and/or the third function including an additional term dependent on the second angle.

By means of a definite relationship between the angle of the total inner reflection (TIR) and the angle of emission as well as incooperating also the third interface (i.e. the interface through which the light rays exit the lens body) of such a TIR lens in the collimation process a better control over lens parameters, such as overall lens size and overall lighting distribution can be achieved. The restriction in the control of the conventional lens parameters is caused by the fact that the entire collimation process is achieved only by means of configuration of the inner refractive wall as well as the outer reflective wall as in the conventional lens light rays emitted by the light source are collimated already after reflection at the outer reflective wall and the second surface is not incorporated in the collimation process. The collimation of the light rays emitted by the light source does not have to be achieved by means of the entrance surface and the total inner reflective surface alone but also the exit surface may be incorporated in the collimation process. Hence, efficiency and performance may be achieved, and of other optical systems as well.

The disadvantages in the fabrication process and for utilisation within a housing of the conventional lenses is caused by the rotational symmetric bowl-shape design of these lenses. However, the described examples of a lens allow different circumferential forms easing the fabrication and utilization.

An interface may be defined as a boundary between two optical media having different optical densities and/or index of refraction. Preferably at the boundary the optical density and/or the index of refection is discontinuous, especially in a propagation direction of a light beam.

The light rays which originally are emitted in all or at least multiple different directions may exit the TIR lens in a first solid angle, especially an angle with reference an optical axis of the TIR lens. Hence, it is possible to define the direction of the collimated light rays as required by application purposes.

The TIR lens may exhibit an periphery representing a substantial rectangular-shaped curve. Such a rectangular shaped curve may lead to a 3D TIR lens which exhibits advantages in the fabrication process and for utilisation within the housing, since the TIR lens can be positioned more easily and more space saving. However, if appropriate, an outer curve of the cross-sectional shape which is at least partly square-shaped, circular-shaped and/or elliptical-shaped can be chosen in order to achieve design-dependent specifications, such as illuminated area or requirements due to housing specifications. In order to achieve a uniform illumination of the entrance surface of the TIR lens, the light emitting source can be placed at the center of gravity of the cross-sectional shape or translated in a direction parallel to the normal vector of said plane.

An appropriate mounting structure for easily fixing the TIR lens to a support structure may be provided with the TIR lens. At the otherwise curved surfaces of the lens, an at least area by area part of the surface of the TIR lens is at least partly of plane nature, allowing to fix the TIR lens easily to a supporting structure. For example a plane structure at the top of the TIR lens and/or sideward of the TIR lens can be provided in order to achieve vertical or horizontal fixing of the lens to the supporting structure.

The TIR lens may include at least area by area medium PMMA, PC and/or glass. By means of the choice of appropriate materials and media, respectively, for the TIR lens body and for the interfaces it is possible to determine and vary the refraction properties at the entrance surface as well as the exit surface and the refractive properties at the total inner reflective surface. Thereby, the collimation process can be controlled.

The angle of reflection at the second interface may be described by a polynomial function. Therefore, one can define an optical axis of the TIR lens as axis of symmetry within a plane in which the propagation path of at least one light ray emitted by the light emitting source passes. The shape of the second interface may be described by said polynomial function. By describing the angle of reflections with respect to the optical axis at the second interface by means of such a polynomial function it is possible to obtain precise control over the lighting distribution. For example the input variable of the polynomial function can be the angle under which the light ray is emitted by the light emitting source with respect to the optical axis. At the same time the angle of emission of a light ray may equal the angle of incident of said light ray on the first interface. An angle of incident may be the angle of a light ray relative to a normal direction of the surface at the point of incident of the light ray on the surface. An angle of emission may be the angle of a light ray relative to a normal direction of the surface at the point of emission of the emitted light ray from the surface. Using such a polynomial function with appropriate coefficients defined control on the lens parameters such as the collimation and/or the overall lens size and/or the illumination area and/or uniformity of illumination the can be achieved. Furthermore, also by varying the shape of the entrance refractive surface the profile of the total inner reflective (TIR) surface can be controlled.

A lens can be produced using a polynomial function which describes the angle of reflection of the light ray impinging on the second interface with respect to the optical axis, whereby said polynomial function is dependent of at least one variable. As the angle of reflection for each point of the second interface is known this means the reflective properties of the second interface are determined, i.e. the reflective property of a point of interface 2 is identical to the angle of reflection of a light ray impinging on that point of interface 2. By choosing the incident angle of the light ray as such a variable, precise control of the overall lighting distribution and/or the size of the optical elements can be achieved. Furthermore, by varying the order of the polynomial function the angle of reflection is changing in different ways dependent on the incident angle, allowing to build different lens shapes and/or achieving different illumination.

The angle of reflection may be calculated in cases when the variable is above a certain limit or below a certain limit. This allows it, for example, to divide the TIR lens in different functional structures determined, e.g. by the angle of emission of the light ray.

The reflective surface, hence the reflection angles, may be defined for different sections of the reflective surface by different polynomial functions, both dependent on the same variable.

Numerous second sections may be present and for each such second section an individual polynomial function is defined. For example there can be a single second section or two, three, four, five, six, seven, eight and/or ten second sections. This allows for a special adaption of the lens shape and lens body by intent.

The first reflective interface may be described by a polynomial third function which allows to design a freeform surface of the entrance interface which in turn allows via adaption of the other interfaces of the lens for more control of the overall lens size and/or the lighting distribution.

The order of the polynomial function may be chosen in order to fit the radiation pattern of the light emitting source. This can be achieved e.g. by choosing a first-, second-, third- or higher-order polynomial function.

The third interface, in particular its curve within the first plane may be calculated using the Cartesian oval method, tangent approximation method, partial differential equation based method, and/or any known design calculation methods. This allows to obtain the appropriate curve for collimation requirements, i.e. it allows to shape the interface as such, that it depends on the second interface in an appropriate way.

By calculating the first, the second, and/or the third interface for numerous rotation angles relative to the symmetry axis, the 3D TIR lens can be obtained from 2D considerations. The first, the second, and the third function may be determined depending on the rotation angle. For example the appropriate functions can be extended by an appropriate product term incorporating the dependency on the rotation angle. This can for example be something like a secans term. Thereby the outer periphery of the TIR lens can be shaped as rectangular one.

BRIEF DESCRIPTION OF THE DRAWINGS

The foregoing summary, as well as the following detailed description, will be better understood when read in conjunction with the appended drawings. For the purpose of illustration, certain examples of the present description are shown in the drawings. It should be understood, however, that the invention is not limited to the precise arrangements and instrumentalities shown. The accompanying drawings, which are incorporated in and constitute a part of this specification, illustrate an implementation of system, apparatuses, and methods consistent with the present description and, together with the description, serve to explain advantages and principles consistent with the invention.

FIG. 10b is a diagram illustrating an example of elements of the cross-sectional view of a 3D TIR lens from FIG. 10a.

FIG. 10c is a diagram illustrating an example of elements of the cross-sectional view of a 3D TIR lens from FIG. 10a.

FIG. 10d is a diagram illustrating an example of elements of the cross-sectional view of a 3D TIR lens from FIG. 10a.

FIG. 10e is a diagram illustrating an example of elements of the cross-sectional view of a 3D TIR lens from FIG. 10a.

DETAILED DESCRIPTION

Figure 1A:
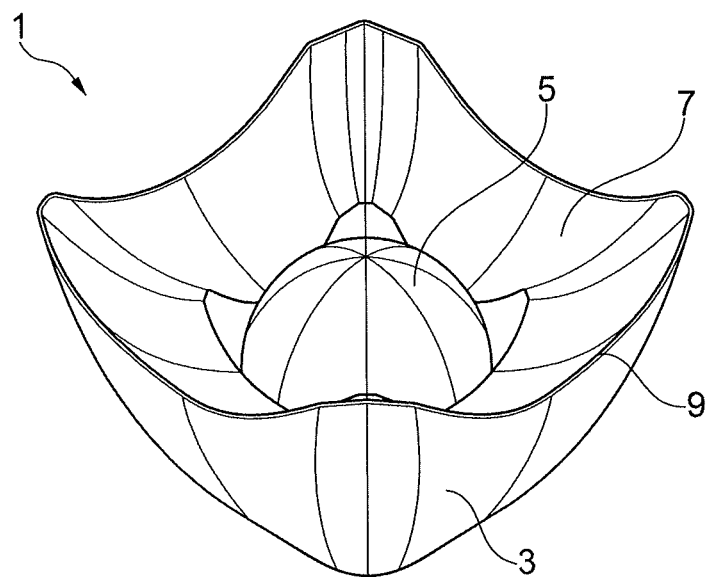
FIG. 1a is a perspective side view of an example of a 3D TIR lens.

Before explaining at least one example of the invention in detail, it is to be understood that the invention is not limited in its application to the details of construction and to the arrangements of the components set forth in the following description or illustrated in the drawings. The Figures and written description are provided to teach any person skilled in the art to make and use the inventions for which patent protection is sought. The invention is capable of other embodiments and of being practiced and carried out in various ways. Those skilled in the art will appreciate that not all features of a commercial embodiment are shown for the sake of clarity and understanding. Persons of skill in the art will also appreciate that the development of an actual commercial embodiment incorporating aspects of the present inventions will require numerous implementation-specific decisions to achieve the developer's ultimate goal for the commercial embodiment. While these efforts may be complex and time-consuming, these efforts nevertheless would be a routine undertaking for those of skill in the art having the benefit of this disclosure.

In addition, it is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity in specific reference to the Figures and are not intended to limit the scope of the invention or the appended claims. Further, it should be understood that any one of the features of the invention may be used separately or in combination with other features. Other systems, methods, features, and advantages of the invention will be or become apparent to one with skill in the art upon examination of the Figures and the detailed description. It is intended that all such additional systems, methods, features, and advantages be included within this description, be within the scope of the present invention, and be protected by the accompanying claims.

It will be appreciated by those skilled in the art that changes could be made to the embodiments described above without departing from the broad inventive concept thereof. It is understood, therefore, that the invention disclosed herein is not limited to the particular embodiments disclosed, but it is intended to cover modifications within the spirit and scope of the present invention as defined by the appended claims.

FIG. 1a shows a perspective side view of a TIR lens 1 including a substantially convex-shaped second interface 3 representing the outside of the TIR lens 1 exhibiting a substantially rectangular periphery appearance. The interface 3 is located between the optically more dens first medium included in the TIR lens 1 and the surrounding optical second medium in form of air. The volume of the TIR lens 1 enclosed by the second interface 3 is bordered by a substantially spherically arranged interface 5 adjacent to a third interface 7. Also both the interface 5 and the interface 7 are borders of the surrounding air and the first medium. The interface 5 and the third interface 7 are connected to each other directly while the third interface 7 and the second interface 3 are connected using a connection element 9.

Figure 1B:
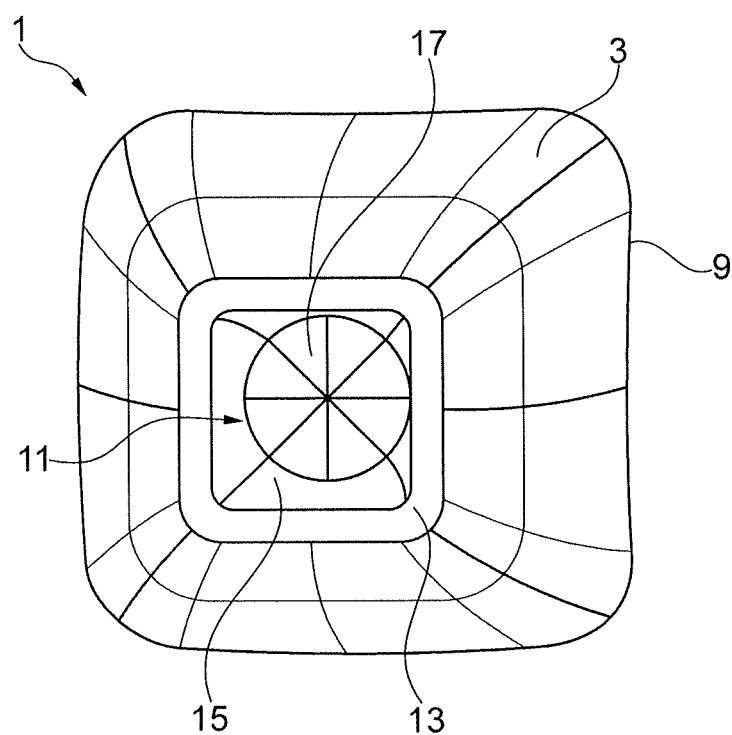
FIG. 1b is a perspective bottom view of an example of a 3D TIR lens.

FIG. 1b shows a perspective bottom view of a TIR lens 1. The central portion of the body of the TIR lens 1 including the first medium comprises a recess 11 for receiving a light emitting source (not shown). The recess 11 describes a first interface 15 and an interface 17, whereby the first interface 15 represents the sidewall and the interface 17 represents the deepest area of the recess 11, which especially represents the top area of the recess 11 in case the lens 1 is located above the light emitting source. Both interfaces, 15 and 17, acting as an entry surface for the light rays emitted by the light emitting source (not shown) placed within the recess 11. The first interface 15 is connected to the second interface 3 using a connection element 13. The connection element 13 is shaped in a substantial rectangular manner.

Figure 2A:
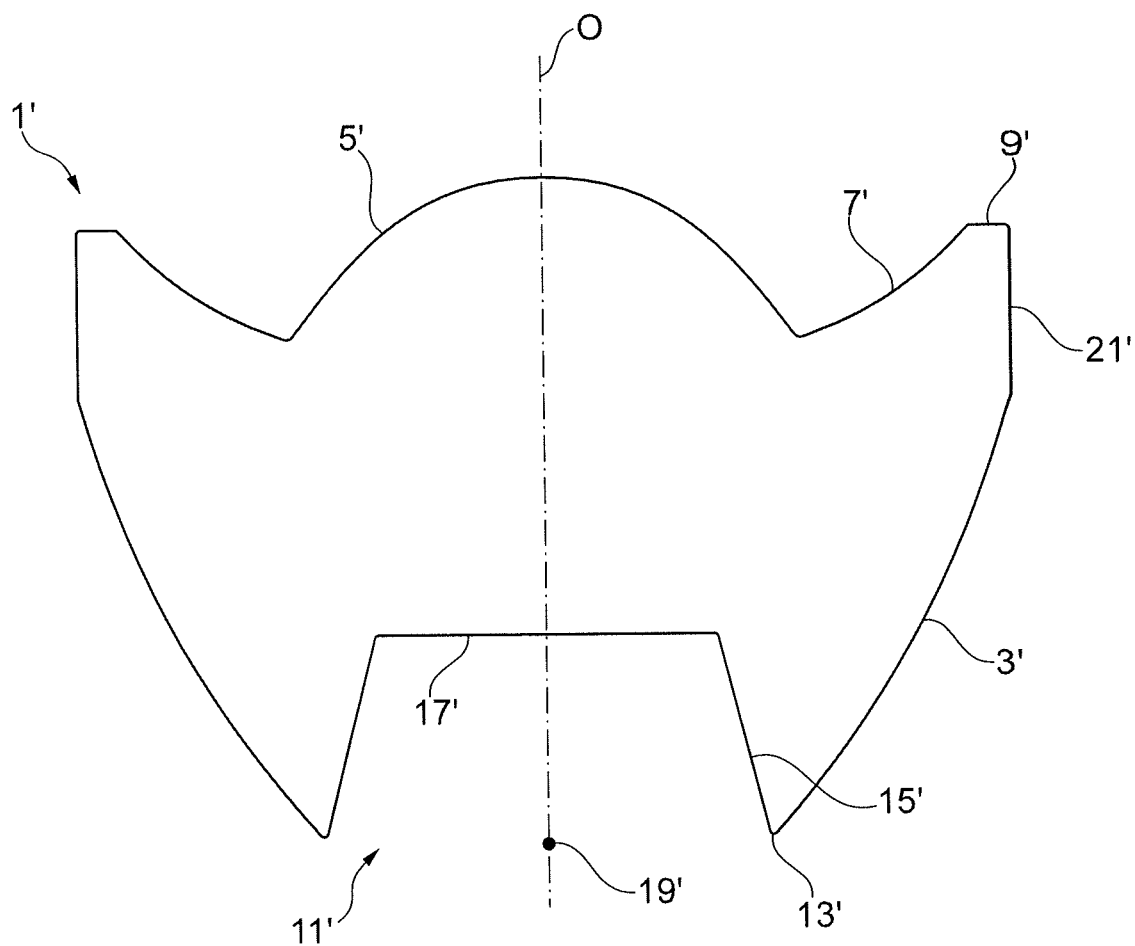
FIG. 2a is a cross-sectional view of an example of a 3D TIR lens.

FIG. 2a shows a cross-sectional view of a 3D TIR lens 1' similar to the 3D TIR lens 1 shown in FIGS. 1a and 1b. Elements corresponding functionally to elements of the preceding embodiment in form of TIR lens 1 have the same reference numbers but single dashed. The TIR lens 1' further includes an area 21' which allows along with connection element 9' of the TIR lens 1', fixing the TIR lens 1' to at least one (not shown) supporting structure. Thus, the area 21' and/or the connection element 9' represent a fourth interface in the sense of the claimed subject matter. Further, a light emitting source 19' at the bottom of the recess 11' is shown. The light emitting source 19' is placed at the center of the recess 11' emitting light rays substantially in the upper half space, i.e. into the inner volume enclosed by the recess 11'.

FIG. 2a further shows an optical axis O. At the same time the optical axis O also represents the symmetry axis of the cross-sectional view of the lens 1', with the optical axis O intersecting the position of the light emitting source 19'. For light rays emitted by the light emitting source 19' the cross-sectional view of the TIR lens 1' in FIG. 2a includes two functional different parts A and B.

Figure 2B:
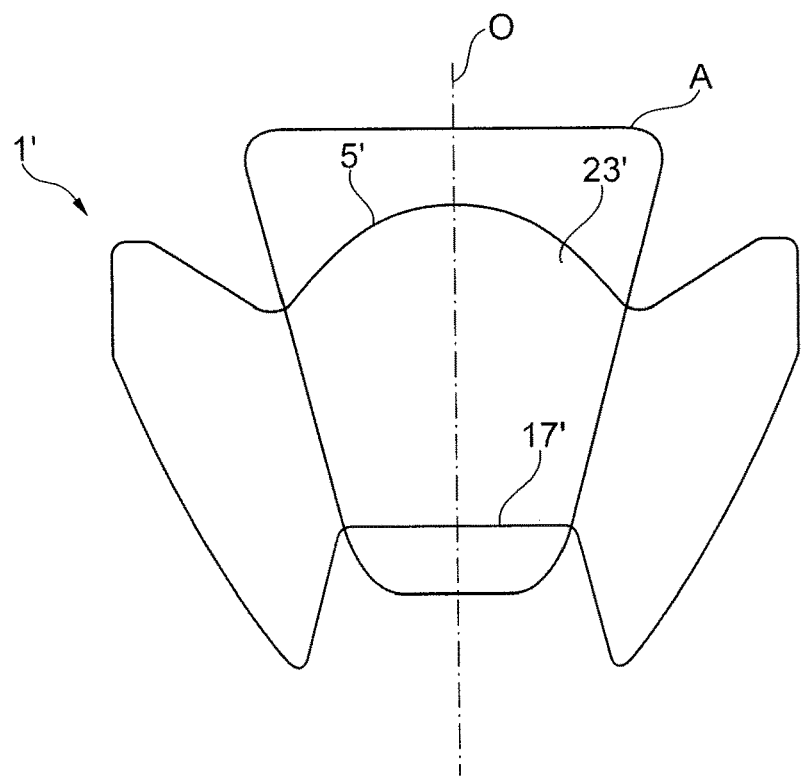
FIG. 2b is a cross-sectional view of an example of a 3D TIR lens with a first domain marked.

FIG. 2b shows the cross-sectional view of a 3D TIR lens 1' of FIG. 2a with the first part A marked. The first part A includes a volume 23' of the TIR lens 1' which volume is bounded substantially by the interface 5' and the interface 17' to the top and bottom, respectively.

Figure 2C:
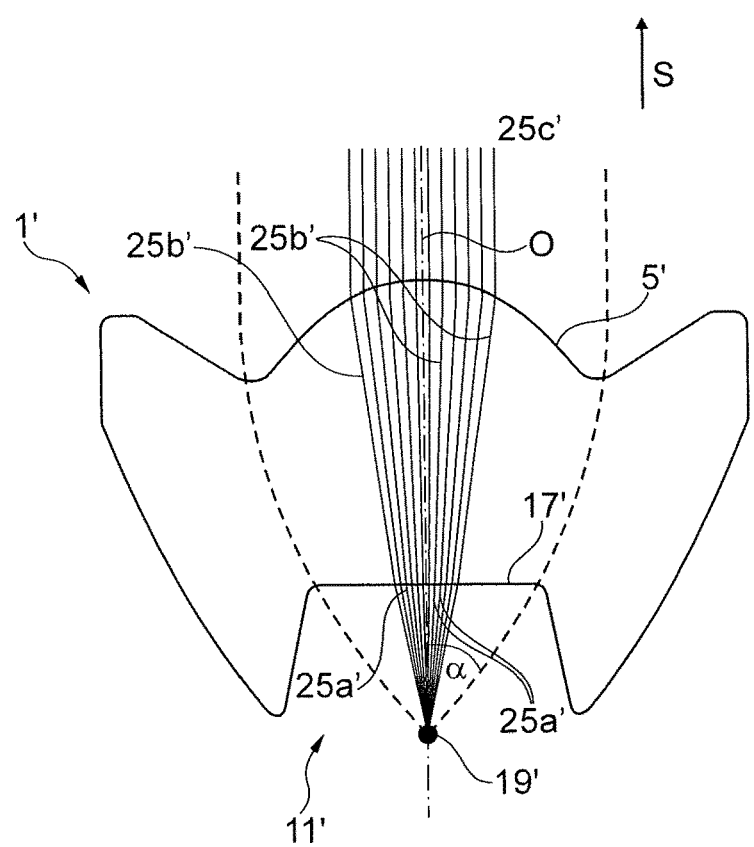
FIG. 2c is a cross-sectional view of an example of a 3D TIR lens with light rays within the first domain.

FIG. 2c shows the cross-sectional view of the TIR lens 1' of FIG. 2b with the light emitting source 19' placed centrically at the bottom of the recess 11'. As shown in FIG. 2c, mainly all light rays 25a' emitted by the light emitting source 19' in the upper half space upon a maximum angle alpha with respect to the optical axis O impinge on the interface 17'. There, the light rays 25a' may be refracted into the volume 23' of the TIR lens 1' and propagating inside the volume 23' as light rays 25b' upon reaching the interface 5' where the light rays 25b' are refracted out of the TIR lens 1'. The light rays 25c' leaving the TIR lens may be substantially parallel to each other and substantially in one and the same direction in space indicated by the arrow S which is parallel to the optical axis O. The propagation path within the TIR lens 1' of the light rays emitted by the light emitting source 19' under an angle alpha represents the boundaries of the volume 23' of the TIR lens 1' to the right and left.

The first functional part A of the TIR lens 1' collimates the light rays 25a' emitted by the light emitting source 19' under different angles of incident with respect to the optical axis O and impinging on the interface 17' using two subsequent appropriate refractions of the light rays.

Figure 2D:
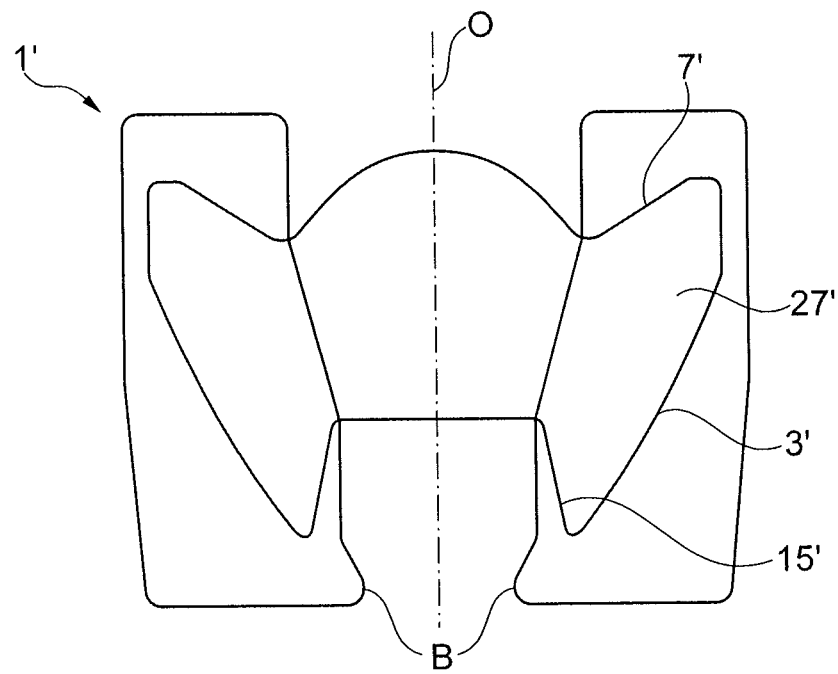
FIG. 2d is a cross-sectional view of an example of a 3D TIR lens with a second domain marked.

FIG. 2d shows the cross-sectional view of the 3D TIR lens 1' of FIG. 2a with the second part B marked. The second part B includes a volume 27' of the TIR lens 1' which volume 27' is bounded to the outside and second medium, respectively, substantially by the first interface 15', the second interface 3' and the third interface 7'. To the inside, the volume 27' is bounded by the extend of volume 23'.

Figure 2E:
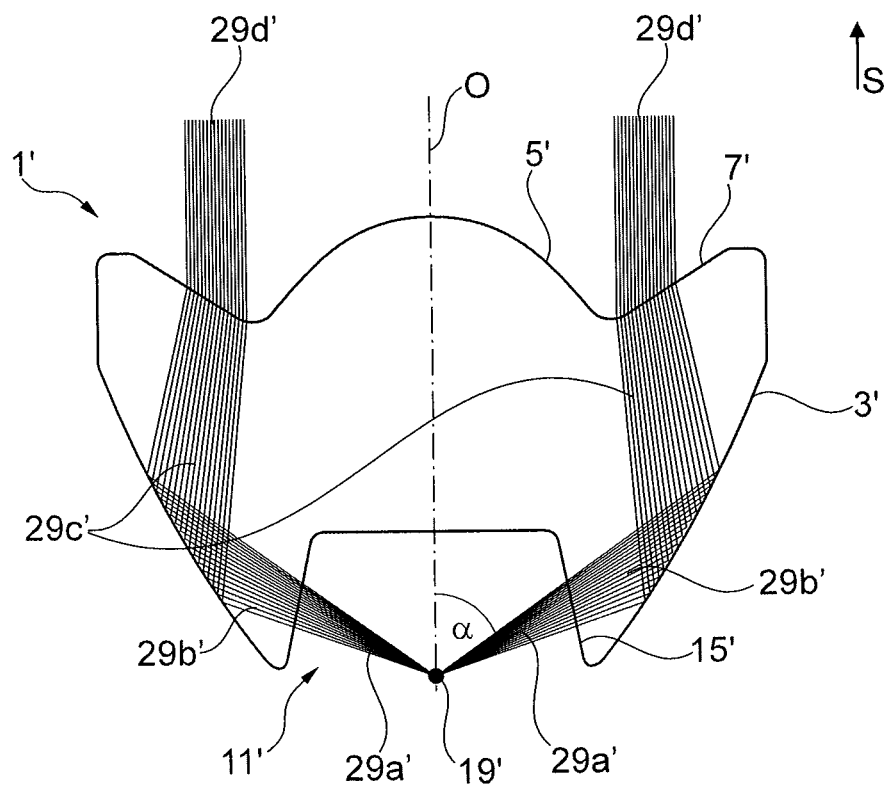
FIG. 2e is a cross-sectional view of an example of a 3D TIR lens with light rays within the second domain.

FIG. 2e shows the cross-sectional view of the TIR lens 1' of FIG. 2d with the light emitting source 19' placed centrically at the open part of the recess 11'. As shown in FIG. 2e, all light rays 29a' emitted by the light emitting source 19 in the upper half space under an minimum angle alpha with respect to the optical axis O impinge on the first interface 15'. There the light rays 29a' are refracted into the volume 27' of the TIR lens 1' and propagating inside said volume 27' as light rays 29b' upon reaching the second interface 3' where the light rays 29b' are reflected due to total internal reflection in the direction of the third interface 7'. The reflected light rays 29c' travel inside the volume 27' upon reaching the third interface 7' where the light rays 29c' are refracted out of the TIR lens 1'. The light rays 29d' leaving the TIR lens 1' may be substantially parallel to each other and substantially in one and the same direction in space indicated by the arrow S which is parallel to the optical axis O.

The second functional part B of the TIR lens 1' collimates the light rays 29a' emitted by the light emitting source 19' under different angles of incident with respect to the optical axis O and impinging on the first interface 15' using subsequent appropriate refraction, reflection and refraction of the light rays.

Referring to FIG. 2c and FIG. 2e, a light ray 25a', 29a' emitted by the light emitting source 19' in the upper half space is propagating either within the volume 23' or within the volume 27' of the TIR lens 1' dependent on the angle under which the light ray 25a', 29a' are emitted by the light emitting source 19' with respect to the optical axis O in the upper half space.

Figure 2F:
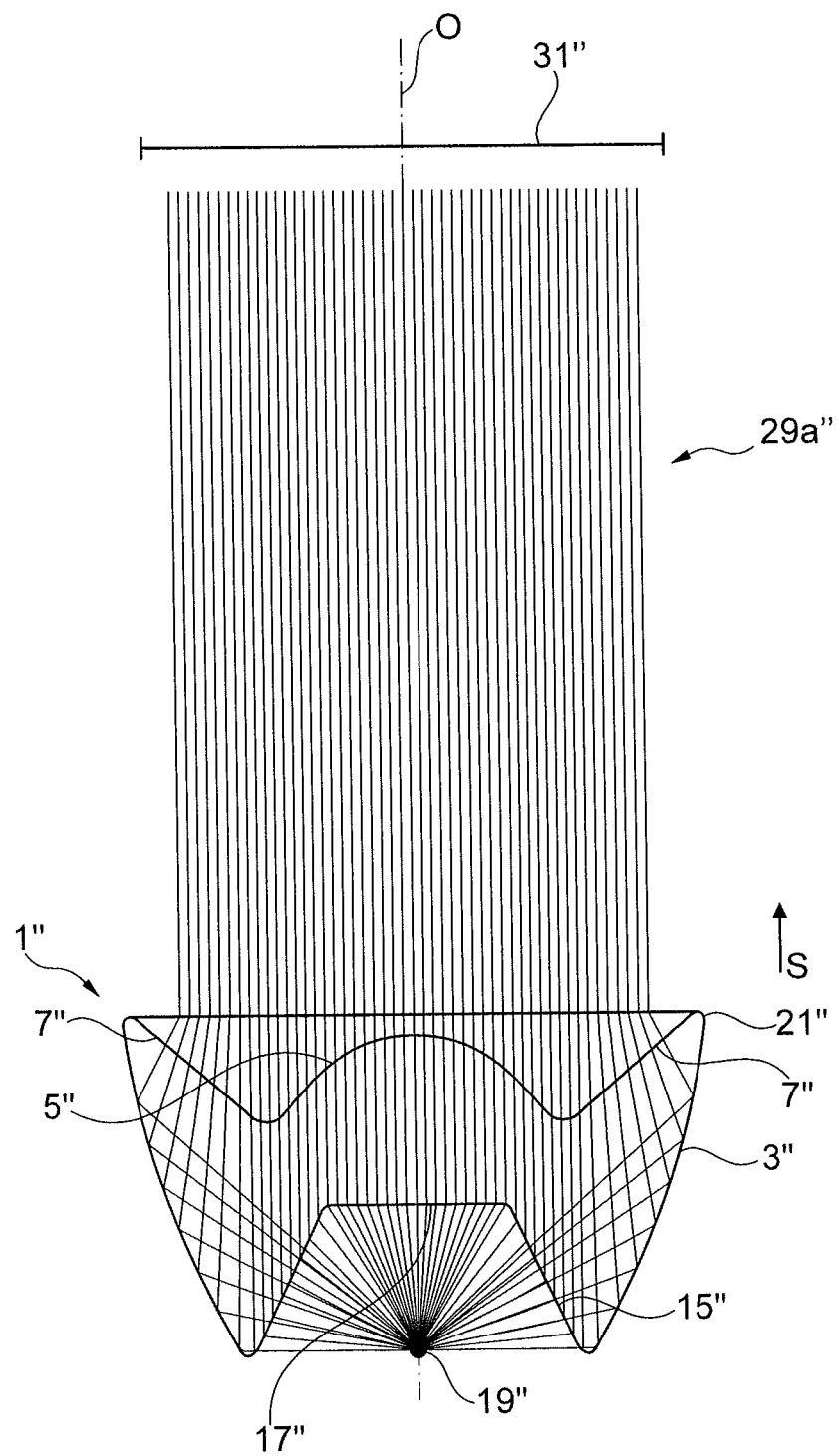
FIG. 2f is a cross-sectional view of an example of a 3D TIR lens with light rays within the first and second domain.

FIG. 2f shows the interplay of the, separately described, two functional parts A and B of another TIR lens 1" in operation. Elements corresponding in function to elements of at least one of the preceding examples 1, 1' carry the same references but dashed twice. All light rays emitted by the light emitting source 19' are substantially collimated by means of the TIR lens 1", i.e. the rays leaving the TIR lens 1" are substantially parallel to each other, and substantially in one and the same direction in space indicated by the arrow S which is parallel to the optical axis O. Thus, in this example, the optical axis O also represents the first solid angle in which lights rays 29d" exit the lens 1".

As a result, an illumination of the target area 31" can be achieved based on design intentions using appropriate configuration of the first interface 15", the second interface 3", the third interface 7", the interface 17" and the interface 5". Furthermore, the individual and appropriate configuration of each of said interfaces 3", 5", 7", 15", 17" allows for control of the size of the optical elements. Hence, collimation of light rays emitted by a light emitting source 19" in the upper half space as well as uniform illumination of a target area 31" may be achieved using the TIR lens 1" including interfaces 15", 3", 7", 17", 5" of appropriate configuration.

The light emitting source 19" may include a light emitting diode (LED). Generally, LED distribution is assumed to be closed to Lambertian distribution but this is not true most of the times. However, by means of appropriate shaping of the interfaces 15", 3", 7", 17", 5" of the TIR lens 1", in particular the first interface 15", the second interface 3" and the third interface 7" an optimized overall illumination can be achieved. A polynomial function is a generalized way to represent any light distribution which may not lambertian. The optimization may be dependent on the design intention. A polynomial function can drive the overall light distribution based on the specific requirements. The design intentions may be specialized, for example, for use of such TIR lens 1" in a SBZA module, a SBZA mirror, a mirror, as ground illumination module, as logo lamp, puddle lamp, vehicle indicators, mirror indicators and/or the like where a high efficient lens system with collimation and/or uniform illumination and/or with controlled overall size of the lens based on the design need is required, especially with rectangular to the outside and/or spherical in the centre.

Depending on the application not a single TIR lens 1, 1', 1" is used but several lenses may be connected to each other and jointly grouped, hence, realizing a lens module. Due to the structure of the single TIR lens 1, 1', 1", especially a general rectangular circumferential form, grouping can be achieved easily.

Figure 3A:
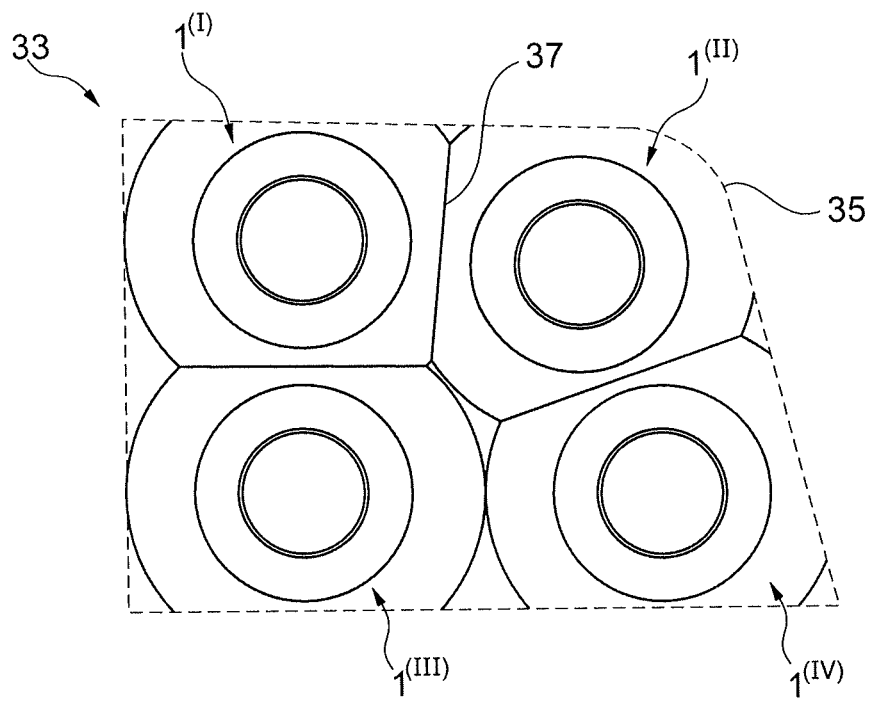
FIG. 3a is a perspective top view of an example of a side blind zone alert (SBZA) module.

FIG. 3a shows a combined four-in-one free-form TIR lens module 33 usable in a SBZA module comprising four single TIR lenses $1^{(I)}$, $1^{(II)}$, $1^{(III)}$ and $1^{(IV)}$ which are grouped in order to form the lens module 33.

Depending on the assembly needs of the module, the arrangement of the individual TIR lenses $1^{(I)}$, $1^{(II)}$, $1^{(III)}$ and $1^{(IV)}$ can be chosen, as required. In FIG. 3a, the requirements for a lens module 33 are such that there is a curved edge corner 35 which is achieved by means of the TIR lens $1^{(II)}$ being truncated at its left side adjacent to the TIR lens $1^{(I)}$, yielding a cutting plane 37 between both single TIR lenses. Further, the assembly may require for example utilization different variations for the single TIR lenses $1^{(I)}$, $1^{(III)}$, $1^{(II)}$ and $1^{(iv)}$.

The flexibility of grouping individual TIR lenses $1^{(I)}$, $1^{(III)}$, $1^{(II)}$, $1^{(iv)}$ in order to obtain a lens module 33 is advantageous since it allows replacing existing lighting modules with new ones including the described example lenses while all assemblies can be considered. An operation propose for such a free-form lens is, for example, in an side blind zone alert (SBZA) module, for ground illumination modules, logo lamp, puddle lamp, vehicle indicators, mirror indicators and/or the like, i.e. for all applications where a high efficient lens system with collimation and/or uniform illumination and/or with controlled overall size of the lens based on the design need is required, especially with rectangular to the outside and/or spherical in the centre.

Figure 3B:
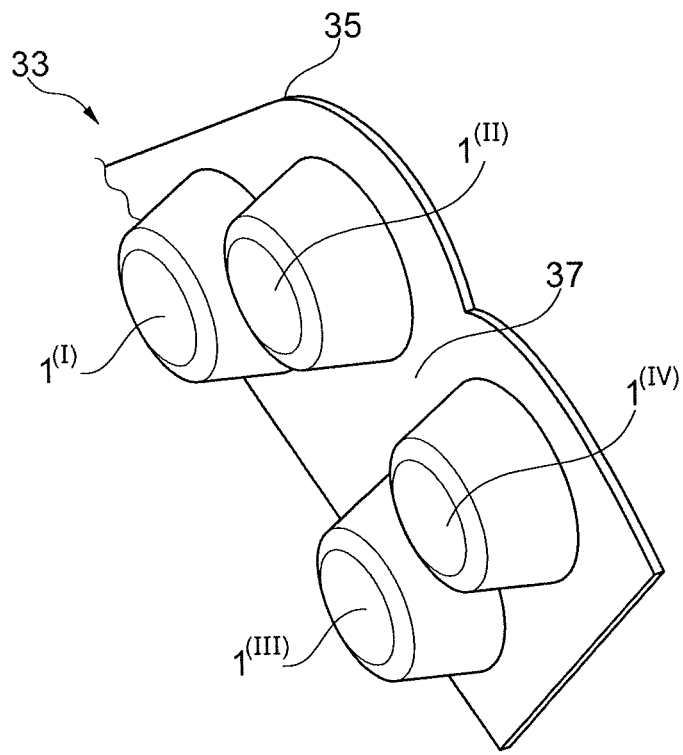
FIG. 3b is a perspective side view of an example of a SBZA module.

FIG. 3b shows a perspective side view of the TIR lens module 33 for SBZA module.

Figure 3C:
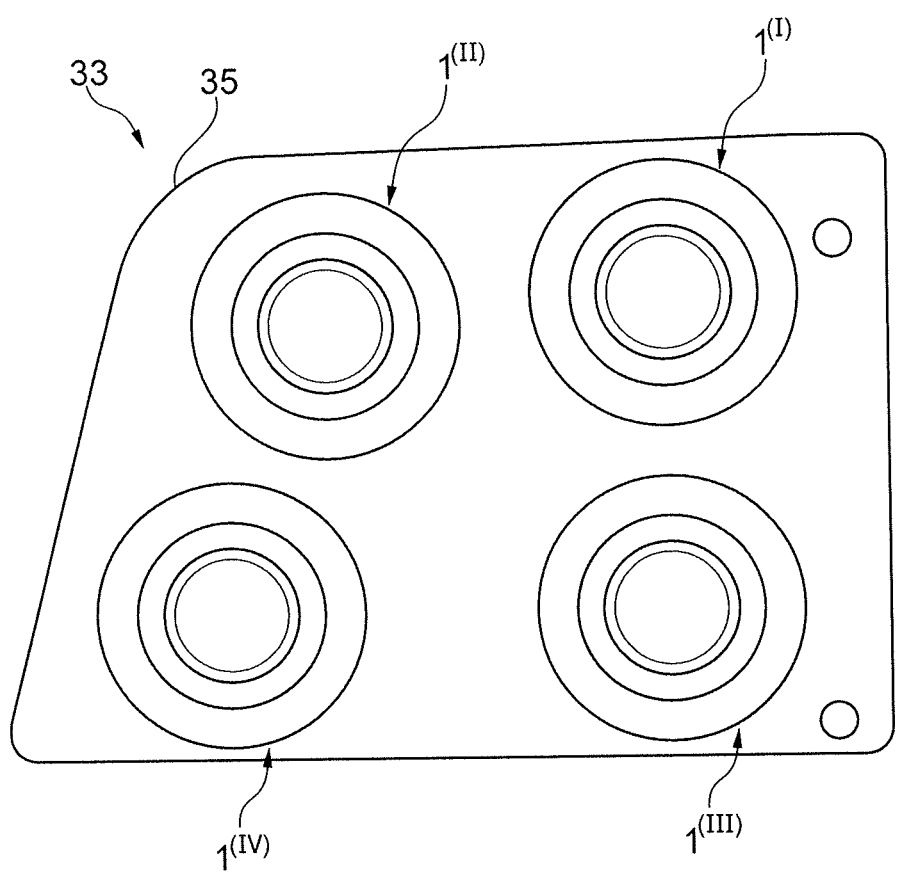
FIG. 3c is a perspective bottom view of an example of a SBZA module.

FIG. 3c shows a perspective bottom view of the TIR lens module 33 for SBZA module. All single TIR lenses $1^{(I)}$, $1^{(II)}$, $1^{(III)}$ and $1^{(IV)}$ do not intersect with each other on the backside of the lens module 33. Hence, no disturbance interactions between the light rays emitted by the particular light emitting sources (not shown) of the TIR lenses $1^{(I)}$, $1^{(II)}$, $1^{(III)}$ and $1^{(IV)}$ occurs. That means the size of each single TIR lens $1^{(I)}$, $1^{(II)}$, $1^{(III)}$ and $1^{(IV)}$ may be kept in such a way that the light from an individual TIR lens $1^{(I)}$, $1^{(II)}$, $1^{(III)}$ and $1^{(IV)}$ does not interfere with nearby TIR lenses.

Figure 4:
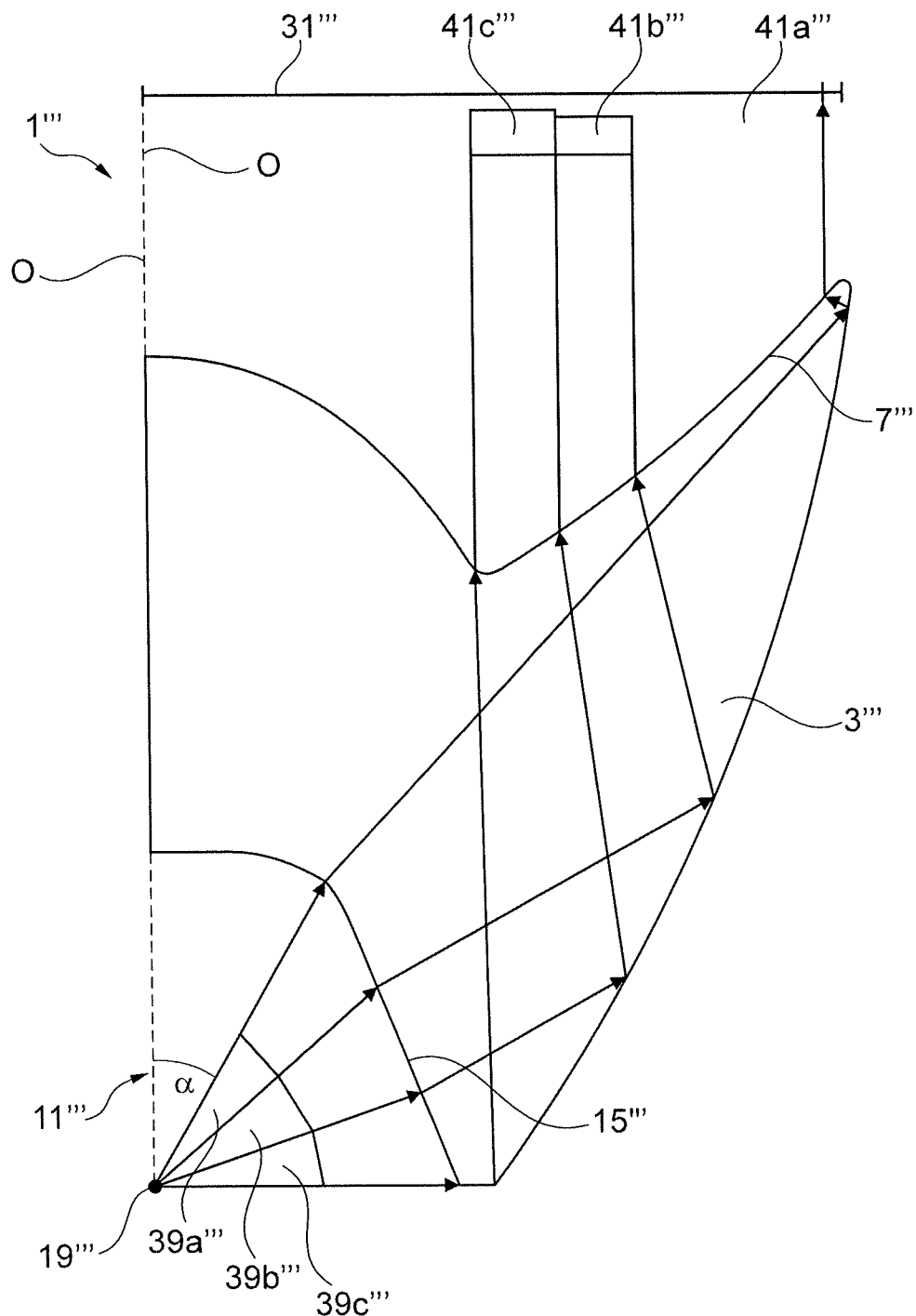
FIG. 4 is a cross-sectional view of an example of a 3D TIR lens with paths of light rays emitted by the light source.

FIG. 4 shows a cross-sectional view of a 3D TIR lens 1'''. Elements corresponding functionally to elements of at least one of the preceding examples carry the same reference numbers but are triple dashed. Due to a symmetric design of the cross section with respect to the optical axis O, only the right-hand part with respect to the optical axis O of the TIR lens 1''' is shown. At the bottom of the recess 11''', a light emitting source 19''' is placed centrically. All possible light rays impinging on the first interface 15''', i.e. emitted by the light emitting source 19''' under an angle larger than alpha, may be divided into three light cones 39a''', 39b''', 39c'''. The angle of emission for rays within the light cone 39a''' may be smaller than the one for light rays within light cone 39b''' and the angle of emission for rays within the light cone 39b''' may be smaller than the one for light rays within light cone 39c'''. The borders of the three light cones 39a''', 39b''', 39c''' may be indicated by four light rays.

The light emitting source 19''' can, for example, include at least one light emitting diode (LED). Generally, an LED has a Lambertian intensity distribution, i.e. the intensity drops of as cosine of the angle of emission. However, it is not true most of the times in practical applications. In order to achieve still (approximately) uniform illumination of the target area 31''', the second interface 3''' and third interface 7''' can be shaped in an appropriate way so that the extension of illumination of the part target area 41*a*''', 41*b*''' and 41*c*''' by the light cone 39*a*''', 39*b*''' and 39*c*''', respectively, can be controlled.

For the TIR lens 1''' in FIG. 4, it has been found that the light rays within the light cone 39*a*''' are of relatively high intensity, hence, a relatively large part target area 41*a*''' of the entire target area 31''' can be illuminated. Further it has been found that the light rays within the light cone 39*b*''' are of least intensity, hence only a relatively small part target area 41*b*''' of the target area 31''' can be illuminated. For the light rays within the light cone 39*c*''' intermediate intensity has been found, hence an intermediate part target area 41*c*''' of the target area 31''' can be illuminated. The appropriate adaption of the second interface 3''' and third interface 7''' to the actual radiation pattern of the light emitting source 19''' leads to a uniform illumination of the target area 31'''.

For the TIR lens 1''' in FIG. 4, this is achieved using a second interface 3''' which may be described by a polynomial function which polynomial function describes the total inner reflection angle of a light ray impinging on the second interface 3''' depending on the incident angle of said light ray on the first interface 15'''.

Describing the interface 3''' and its reflection properties using a polynomial function the radiation pattern of a non-lambertian light emitting source 19''' can be fitted to identify which solid cone of the light coming out of the source is giving high amount of flux and accordingly with help of the relationship between corresponding reflection from the second interface 3''' the required light distribution can be achieved. Accordingly, the polynomial function can drive the overall distribution based on the specific requirements.

Consequently, the boundary conditions constraints the flux cones to its corresponding target area to be illuminated. Selection of the order of the polynomial function and corresponding boundary condition may be based on the results obtained and the desired output. In cases where the boundary conditions are not obvious, an iterative process may be applied from zero-order polynomial function to get an extra condition and keep on improving the performance until the requirements are met with minimize variations.

FIGS. 5*a*, 5*b*, 5*c* and 5*d* show the effect the order of the polynomial function chosen for describing the interface 3/its reflection properties has with respect to the control of collimation, uniform illumination and overall lens size. Due to symmetric design of the cross section with respect to the optical axis O only the right-hand part with respect to the optical axis O of the TIR lens $1^{iv}$, $1^{v}$, $1^{vi}$, $1^{vii}$ is shown.

To determine the coefficients of the polynomial function of order N, N+1 boundary conditions, which are especially the values for the angle of emission and the appropriate angle of reflection, are required. The corresponding values give a system of linear equations which can be solved for the coefficients for example using Gauss elimination method or any other appropriate numerical method known to the person skilled in the art. By determining all coefficients for every angle of emission the corresponding angle of reflection can be obtained to achieve the shape of the second interface 3.

Figure 5A:
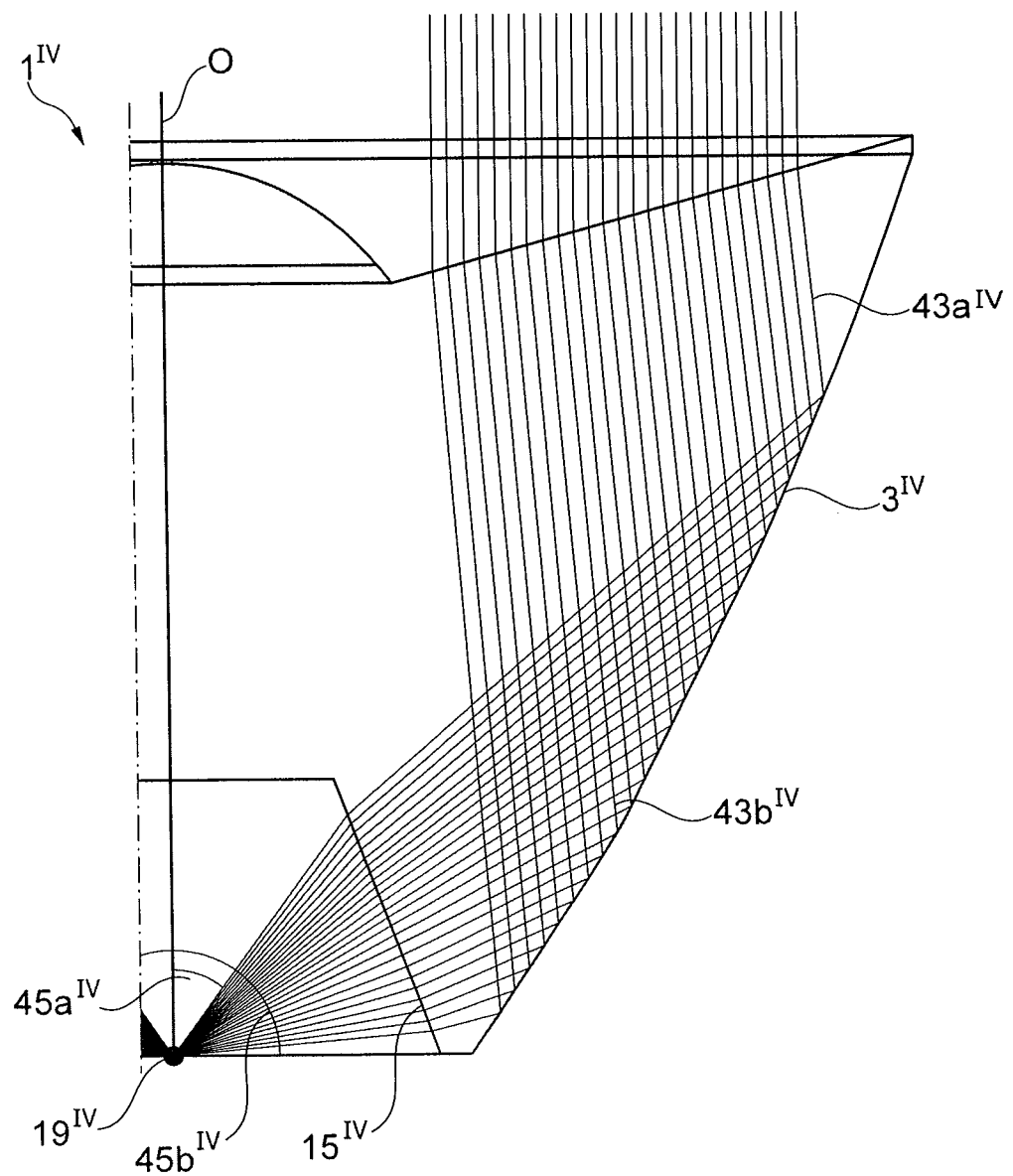
FIG. 5a is a cross-sectional view of an example of a 3D TIR lens with paths of light rays for zero-order polynomial function.

FIG. 5*a* shows a conventional TIR lens $1^{iv}$. Elements corresponding functionally to elements of at least one of the preceding examples have the same reference but are identified by a superscript iv. TIR lens $1^{iv}$ includes an interface 3 that is designed such that the angles of reflection 43$a^{iv}$, 43$b^{iv}$ of the rays on interface $3^{iv}$ are equal for all rays, i.e. for all angles of incident 45$a^{iv}$, 45$b^{iv}$. This can easily be seen as the rays reflected by the surface of interface $3^{iv}$ are all parallel to each other already within the lens body. Consequently, in the state of the art a zero-order polynomial function is used which does not allow to control the illumination of the target area.

Figure 5B:
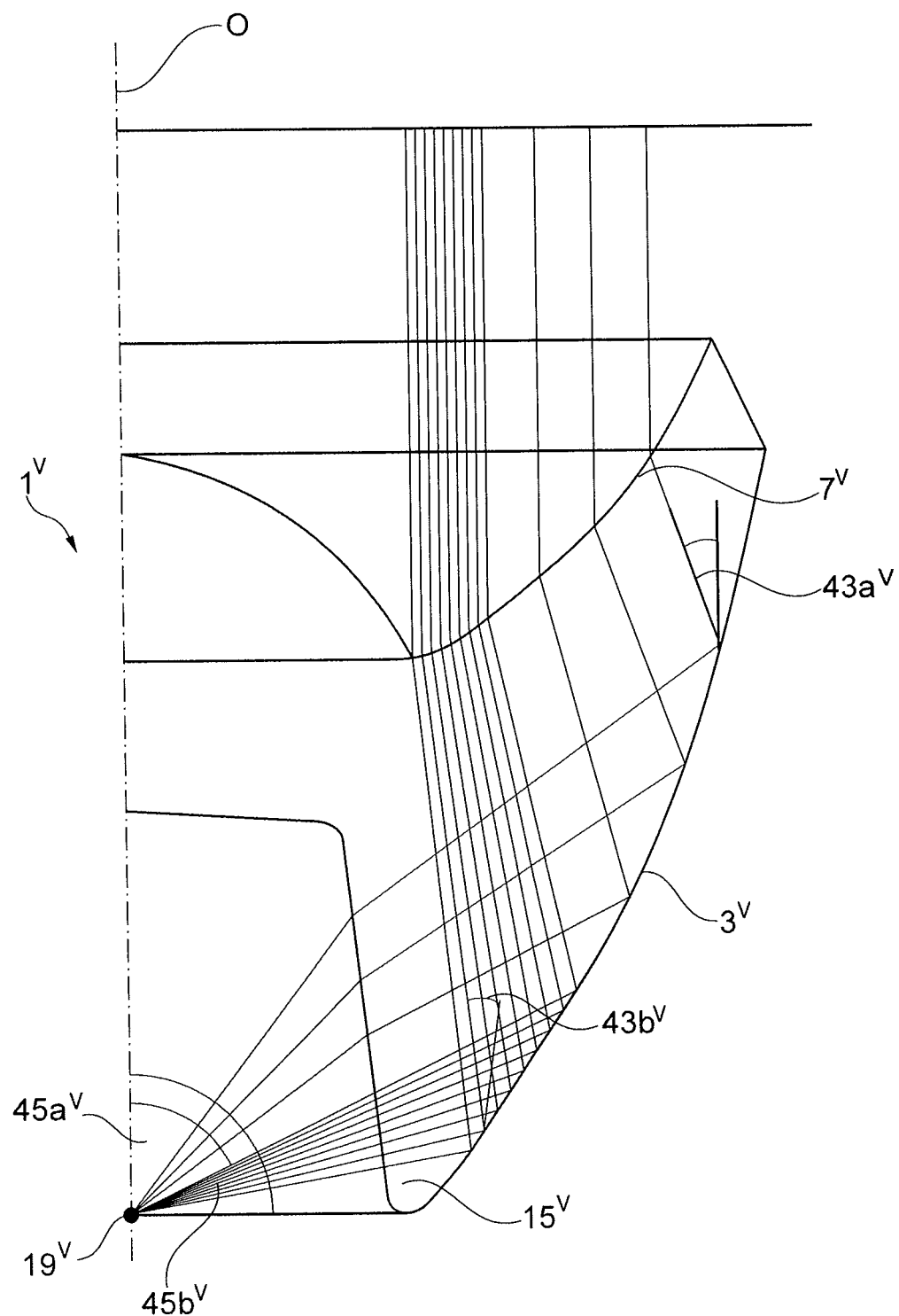
FIG. 5b is a cross-sectional view of an example of a 3D TIR lens with paths of light rays for first-order polynomial function.

FIG. 5*b* shows an example of a TIR lens $1^{v}$. Elements corresponding functionally to elements of at least one of the preceding examples have the same reference number but are identified by a superscript v. TIR lens $1^{v}$ includes a second interface $3^{v}$ where the angle of reflections are described by means of a first-order polynomial function. The angle of reflection 43$a^{v}$, 43$b^{v}$ of a light ray impinging on the second interface $3^{v}$ increases linearly as the angle of incident 45$a^{v}$, 45$b^{v}$ of the light ray at the first interface $15^{v}$ decreases. From the illustration in FIG. 5*b* it is obvious that for each angle of incident and individual angle of reflection is defined, thus, a normal vector. Via the normal vectors the appropriate shape of the interface $3^{v}$ is defined.

In order to obtain the first-order polynomial function, two coefficients may be required to be determined for which two boundary conditions are required, which are the values of appropriate number of pairs for the values of the incident angle and reflection angle. The corresponding values will give a system of linear equations which can be solved for the coefficients using for example Gauss Elimination Method or any other appropriate numerical method known in the state of the art. By determining the coefficients for every angle of incident corresponding angle of reflection value can be obtained to achieve the lens shape.

In case of the TIR lens $1^{v}$ shown in FIG. 5*b*, the angle of reflection is changing linearly from 25° to 0° while the incident angle is changing from 30° to 90°, with the latter range is the range of the incident angle for which the reflective surface/second interface $15^{v}$ comes into effect. For example, the coefficients for such a first order polynomial function may be achieved by pairs of values for the emission angle and the reflection angle (30°, 25°) and (90°, 0°).

The TIR lens $1^{v}$ shown in FIG. 5*b* can be used for applications where the overall flux from the light emitting source $19^{v}$ is reducing linearly with increasing emitting angle. In this case, one cannot achieve specific requirements, however, where one wants to redirect flux of specific emitting cones to hit a specific a target area. Illumination of the target area $31^{v}$ can be achieved to be more uniform in comparison to state of the art TIR lens $1^{iv}$ and/or according to the design need.

Figure 5C:
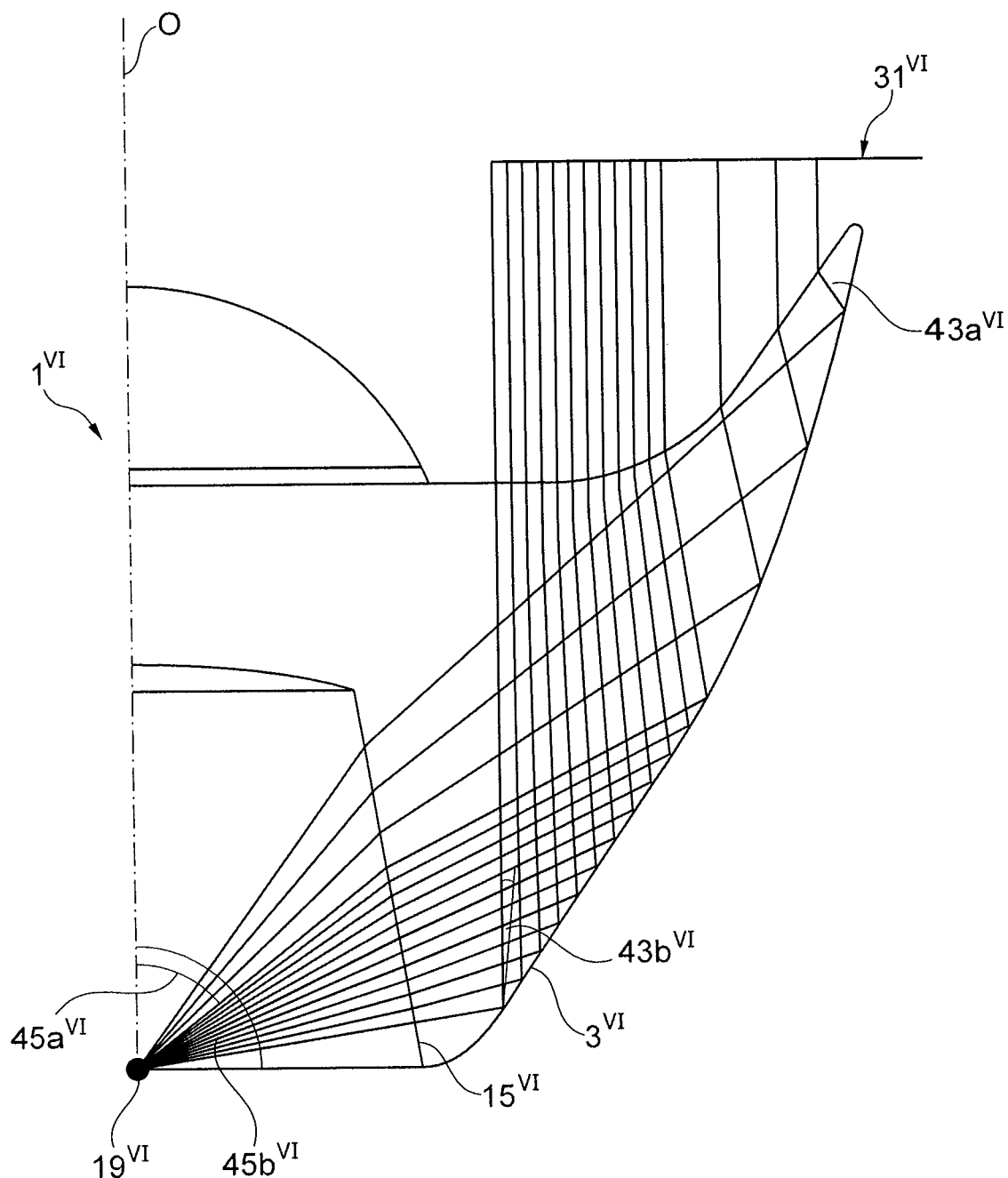
FIG. 5c is a cross-sectional view of an example of a 3D TIR lens with paths of light rays for second-order polynomial function.

FIG. 5*c* shows another example of the TIR lens $1^{vi}$. Elements corresponding functionally to elements of at least one of the preceding examples have the same reference numbers but are identified by a superscript vi. TIR lens $1^{vi}$ includes a second interface $3^{vi}$ where the angle of reflections are described by means of a second-order polynomial function. Hence, the angle of reflection 43$a^{vi}$, 43$b^{vi}$ of a light ray impinging on the second interface $3^{vi}$ increases parabolically as the angle of incident 45$a^{vi}$, 45$b^{vi}$ of the light ray at the first interface $15^{vi}$ decreases. From the illustration in FIG. 5*c*, it is obvious that for each angle of incident and individual angle of reflection is defined, thus, a normal vector. Via the normal vectors, the appropriate shape of the interface $3^{vi}$ is defined.

In order to obtain the second-order polynomial function three coefficients may be required to be determined for which three boundary conditions are required, which are the values of appropriate number of pairs for the values of the incident angle and reflection angle. The second order of polynomial function uses an extra condition with respect to the first order of polynomial function. The overall control of light distribution can be improved. The corresponding values will give a system of linear equations which can be solved for the coefficients using Gauss Elimination Method or any other numerical method known in the state of the art. By getting the coefficients for every angle of incident corresponding angle of reflection value can be obtained to achieve the lens shape.

In case of the TIR lens $1^{vi}$ shown in FIG. 5c the angle of reflection is changing parabolically from 25° to 10° and from 10° to 0° while the incident angle is changing, respectively, from 30° to 50° and from 50 to 90°. For example, the coefficients for such a second-order polynomial function are achieved by pairs of values for the emission angle and the reflection angle (30°, 25°), (50°, 10°) and (90°, 0°).

The TIR lens $1^{vi}$ shown in FIG. 5c can be used for applications where the requirements of the specific area needs less light but the overall target area should be increased. This type of second-order polynomial function can support to achieve the target. It gives better control of the flux and with more variations of the lighting distribution can be achieved with respect to the first-order of polynomial function. Illumination of the target area $31^{vi}$ can be achieved to be more uniform and/or according to the design need.

Figure 5D:
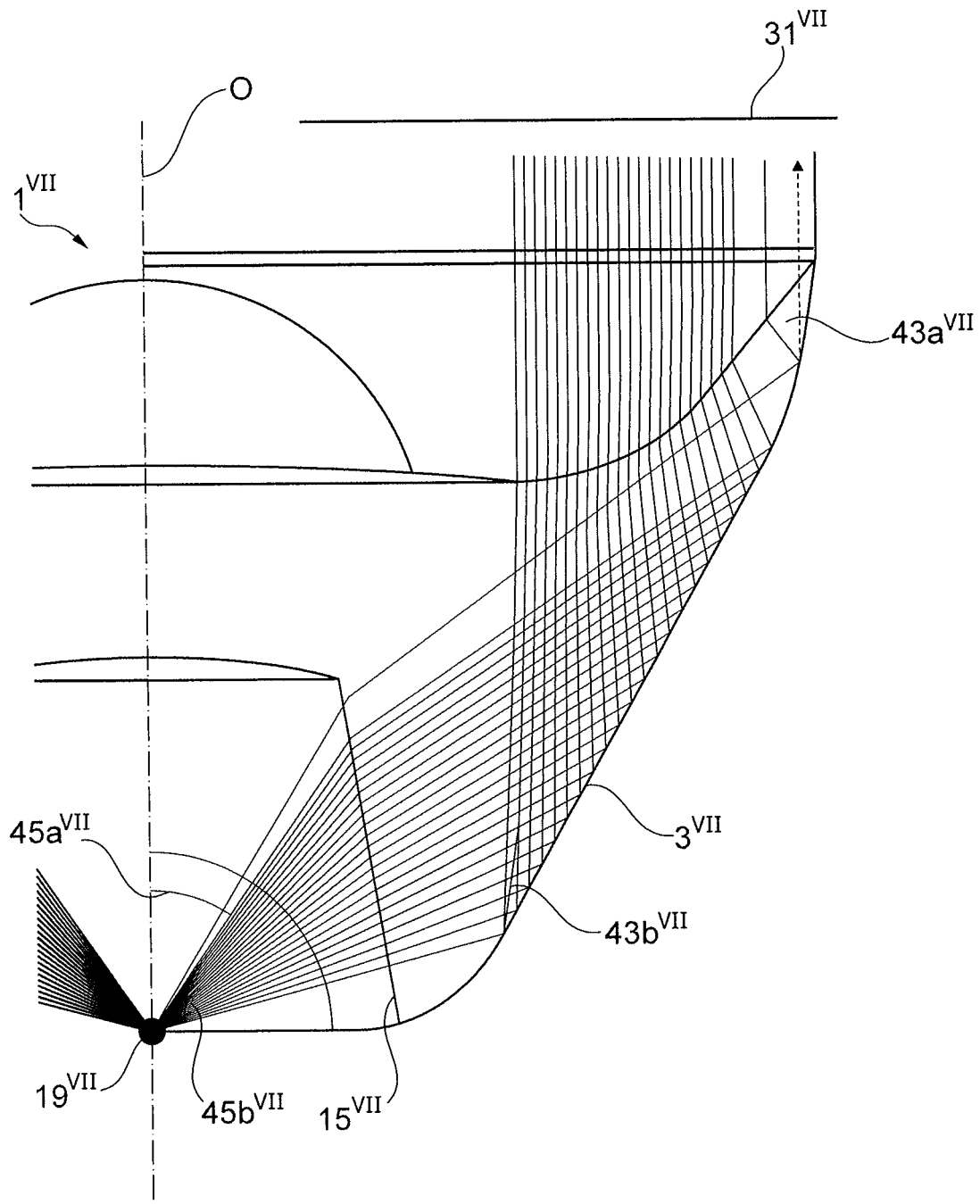
FIG. 5d is a cross-sectional view of an example of a 3D TIR lens with paths of light rays for third-order polynomial function.

FIG. 5d shows another example of the inventive TIR lens $1^{vii}$. Elements corresponding functionally to elements of at least one of the preceding embodiments carry the same reference numbers but are identified by a superscript vii. The lens $1^{vii}$ includes a second interface $3^{vii}$ where the angle of reflections are described by means of a third-order polynomial function. The angle of reflection $43a^{vii}$, $43b^{vii}$ of a light ray impinging on the second interface $3^{vii}$ increases cubically as the angle of incident $45a^{vii}$, $45b^{vii}$ of the light ray at the first interface $15^{vii}$ decreases. From the illustration in FIG. 5d it is obvious that for each angle of incident and individual angle of reflection is defined, thus, a normal vector. Via the normal vectors the appropriate shape of the interface $3^{vii}$ is defined.

In order to obtain the third-order polynomial function four coefficients are required to be determined for which four boundary conditions are required, which are the values of appropriate number of pairs for the values of the incident angle and reflection angle. The third-order polynomial function uses an extra condition with respect to the second-order polynomial function. So, giving an extra boundary condition it is equivalent to an extra constrained to control the overall lighting distribution. The overall control of light distribution can be improved since a higher control of the flux can be achieved compared to zero-, first- and/or second-order polynomial functions. The corresponding values will give a system of linear equations which can be solved for the coefficients using for example Gauss Elimination Method or any other appropriate numerical method known to a person skilled in the art. By getting the coefficients for every angle of incident corresponding angle of reflection value can be obtained to achieve the lens shape.

Referring to the TIR lens $1^{vii}$ shown in FIG. 5d, the angle of reflection is changing cubically from 25° to 10°, from 10° to 3.5° and from 3.5° to 0° while the incident angle is changing, respectively, from 30° to 50°, from 50 to 60° and from 60° to 90°. For example, the coefficients for such a second-order polynomial function are achieved by pairs of values for the emission angle and the reflection angle (30°, 25°), (50°, 10°), (60°, 3, 5°) and (90°, 0°).

The TIR lens $1^{vii}$ shown in FIG. 5d can be used for applications where better control of the flux and more variations of the lighting distribution is required. Hence, illumination of the target area $31^{vii}$ can be achieved to be more uniform and/or according to the design need.

Figure 6:
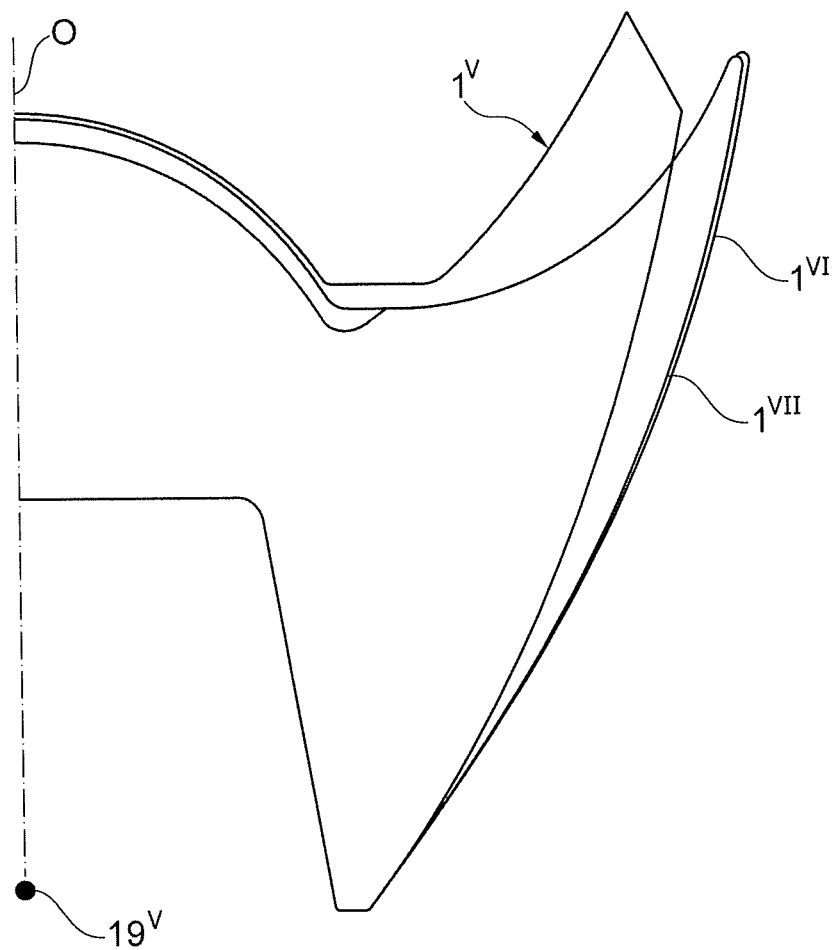
FIG. 6 is multiple cross-sectional views of an example of a 3D TIR lens for first to third-order polynomial functions.

FIG. 6 shows the cross-sectional views of other examples of the TIR lenses $1^{v}$, $1^{vi}$ and $1^{vii}$ from FIGS. 5b, 5c and 5d for comparison purposes with respect to the effect of choosing first-, second- and third-order polynomial function describing the reflection properties of interface 3. It is evident from FIG. 6 that not only the lighting distribution is controlled by the choice of the order of the polynomial function as shown previously for FIGS. 5a to 5d but also the overall size (aperture size) of the TIR lens $1^{v}$, $1^{vi}$, $1^{vii}$ is controlled. With every extra degree of polynomial function, an extra condition is added to control the overall distribution effectively and achieving various design needs. Especially realizing the light emitting source $19^{v}$, $19^{vi}$, $19^{vii}$ from which $19^{v}$ is shown exemplarily in FIG. 6, with at least one LED which lighting distribution is not lambertian distribution a generalized high degree of polynomial relationship can support to obtain a lens geometry which fits for the particular radiation pattern.

Figure 7A:
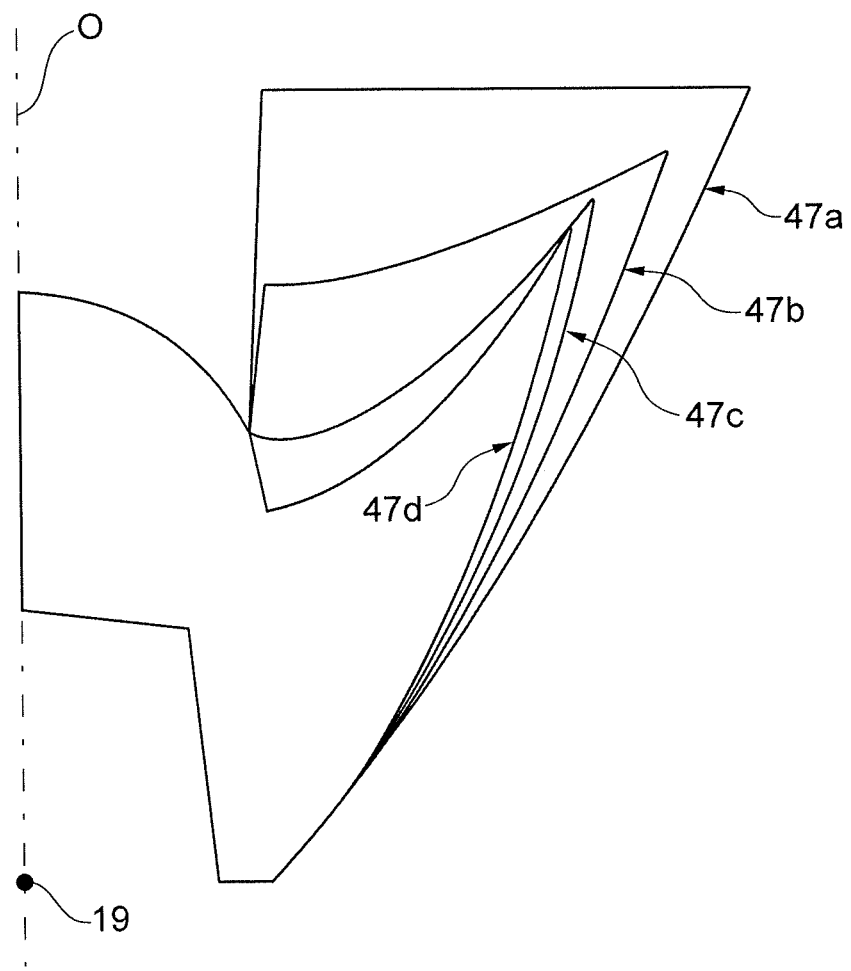
FIG. 7a is multiple cross-sectional views of an example of a 3D TIR lens for different values of the maximum angle of reflection.
Figure 7B:
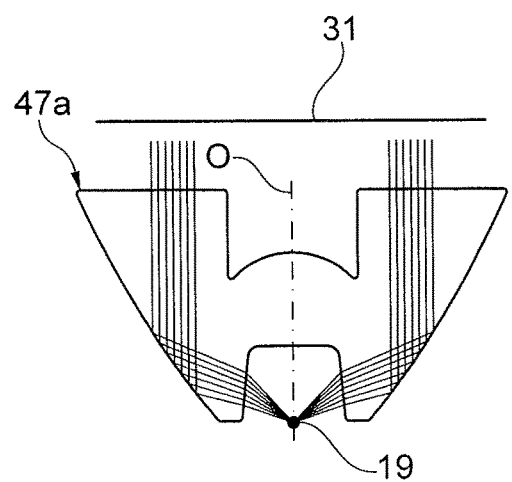
FIG. 7b is a diagram illustrating an example of paths of light rays for a certain maximum angle of reflection.
Figure 7C:
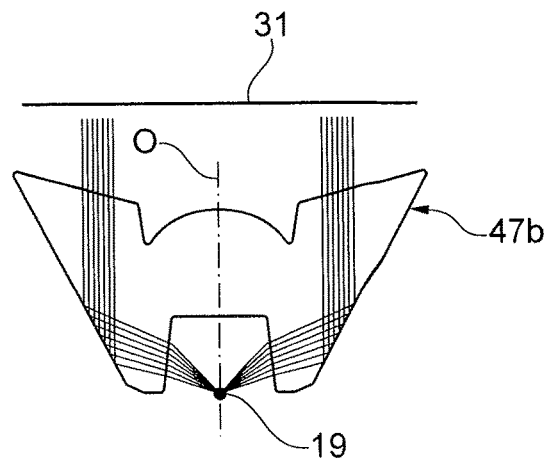
FIG. 7c is a diagram illustrating an example of paths of light rays for a certain maximum angle of reflection.
Figure 7D:
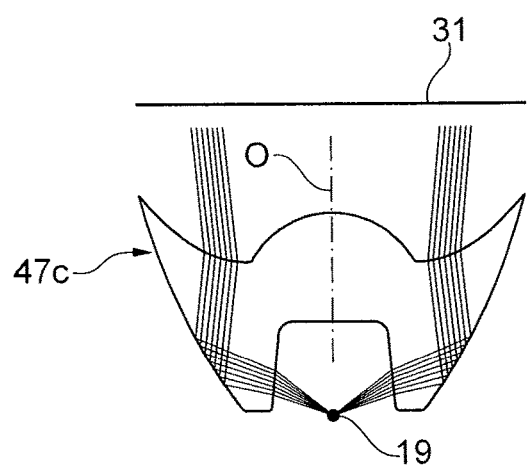
FIG. 7d is a diagram illustrating an example of paths of light rays for a certain maximum angle of reflection.
Figure 7E:
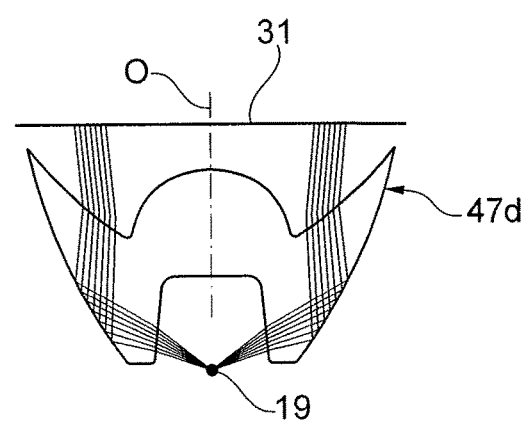
FIG. 7e is a diagram illustrating an example of paths of light rays for a certain maximum angle of reflection.

FIG. 7a shows in which way the choice of the maximum value of the angle of reflection effects the overall lens size when a first-order polynomial function is used for describing the second interface 3 of a TIR lens 1 using additional examples of the lens. For an angle of incident of 90° the value of the angle of reflection is 0° (i.e. parallel to optical axis O) which then linearly increases to the maximum value of the angle of reflection. The lens shape 47a is obtained for an maximum angle of reflection of 0°, i.e. the reflected rays are all parallel to the optical axis upon reflection. Hence, the third surface is plane. The lens shape 47b is obtained for a maximum angle of reflection of 10°. The lens shape 47c is obtained for a maximum angle of reflection of 20°. The lens shape 47d is obtained for a maximum angle of reflection of 25°. It is evident from FIG. 7a that not only the order of the polynomial function but also the constrains, in particular the maximum value of the angle of reflection, controls the lighting distribution and/or the overall lens size.

FIG. 7b through FIG. 7e shows, respectively, for lens shapes 47a through 47d light rays emitted by the light emitting source 19 for selected examples of angles of emission. It is evident from FIG. 7a through FIG. 7e that both, overall lens size as well as illumination of the target area 31 can be controlled by means of the order of the polynomial function.

Figure 8:
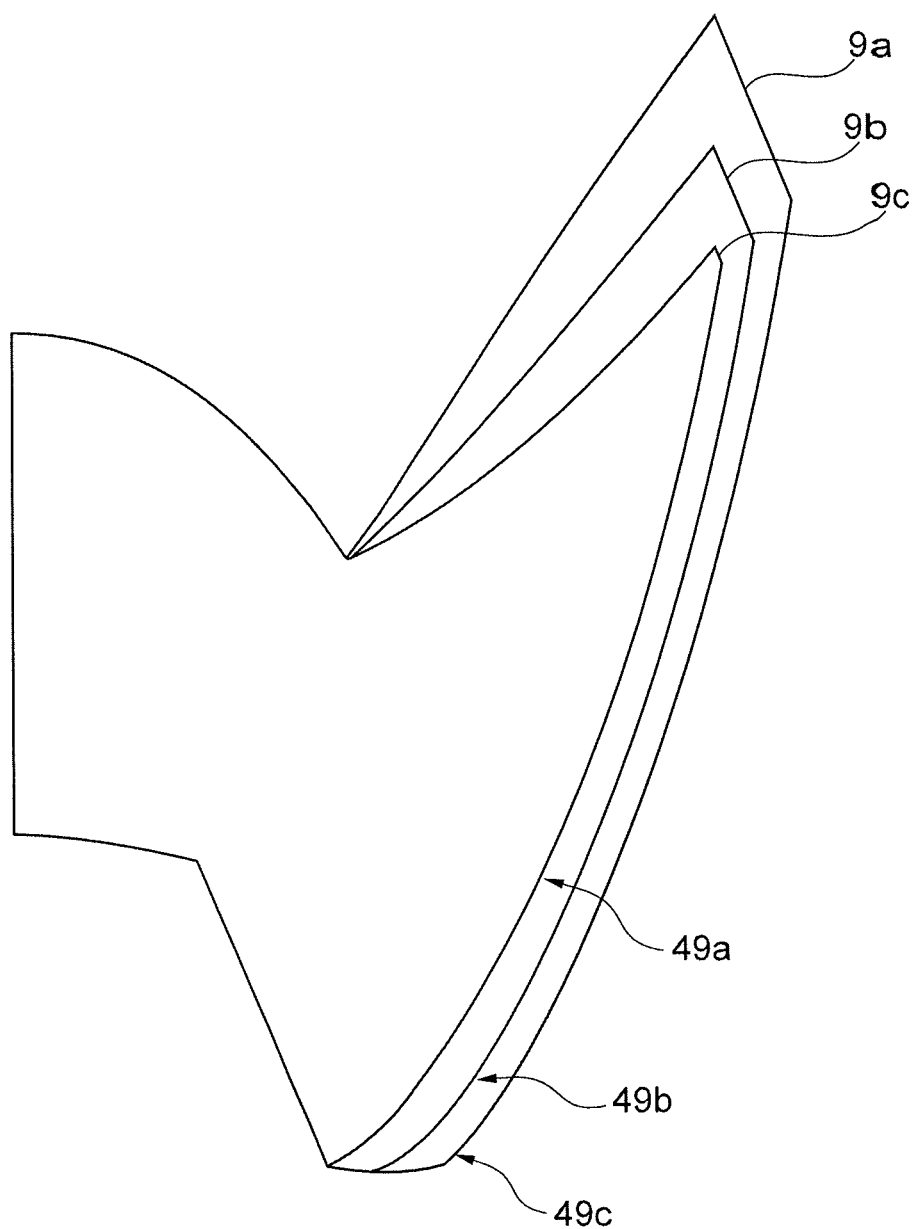
FIG. 8 is multiple cross-sectional views of an example of a 3D TIR lens for different values of edge dimension.

FIG. 8 shows three different lens shapes 49a, 49b, 49c as further examples of the TIR lens obtained for different edge dimensions and dimensions of connection elements 9a, 9b, 9c of the TIR lens which is defined by the design need and manufacturing feasibility. Lens shape 49a is obtained for a smaller value of the edge dimension 9a than the shape of the lens 49b which in turn has a smaller value of the of edge dimension 9b than the lens shape 49c. FIG. 8 shows that by means of the value of the edge dimension the lens size can be controlled, too, besides given requirements for mounting the lens to some supporting structure. In vertical direction, the edge dimension is governed by minimum thickness requirements as well as the overall area to be illuminated.

Figure 9:
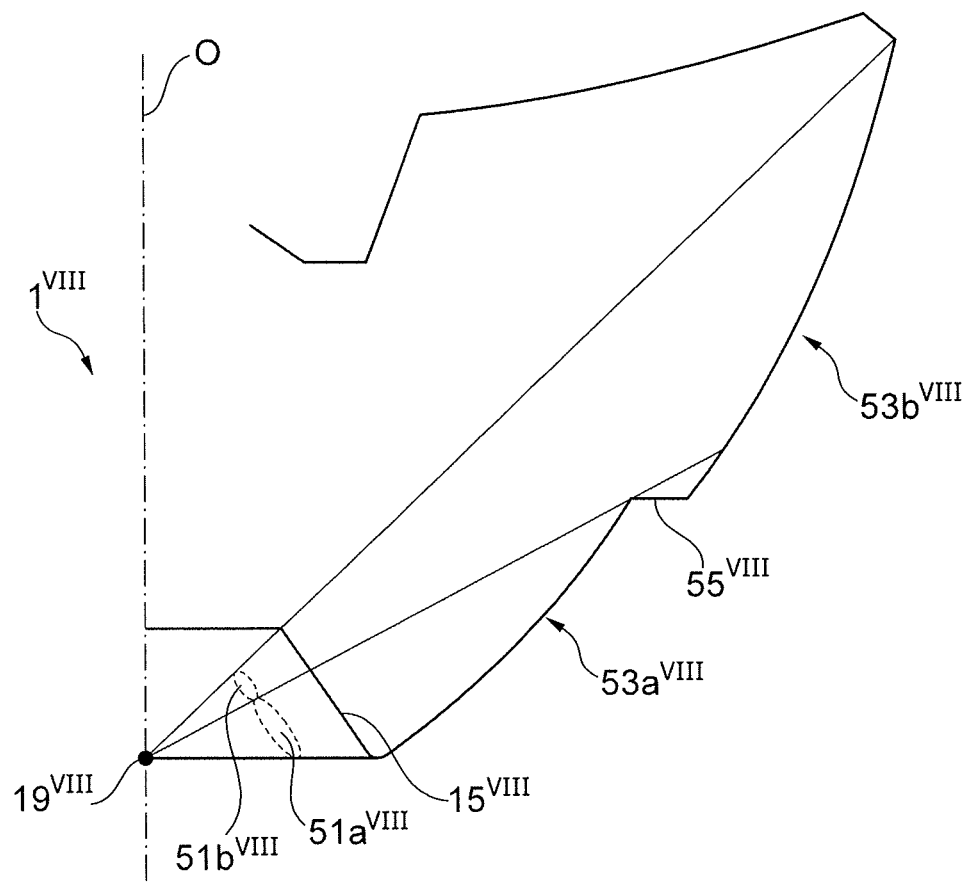
FIG. 9 is a cross-sectional view of an example of a 3D TIR lens with a reflective interface comprising two different sections.

FIG. 9 shows another example of the TIR lens $1^{viii}$. Elements corresponding functionally to elements of at least one of the preceding examples have the same reference numbers but are identified by a superscript viii. In the lens $1^{viii}$, a light ray emitted by the light emitting source $19^{viii}$ having an angle of emission such that the light ray is within the light cone $51a^{viii}$ impinges after refraction at the first interface $15^{viii}$ on a first second interface $53a^{viii}$. A light ray emitted by the light emitting source $19^{viii}$ having an angle of emission such that the light ray is within the light cone $51b^{viii}$ impinges after reflection at the first interface $15^{viii}$ on a second second interface $53b^{vii}$. For the TIR lens $1^{viii}$ shown in FIG. 9 the first second interface $53a^{viii}$ is effective for rays emitted by the light emitting source $19^{viii}$ under angles of emission between 60° and 90° and its described by a cubical function. While the second interface $53b^{viii}$ is effective for rays emitted by the light emitting source $19^{viii}$ under angles between 45° to 60° and its described by a linear function. The first second interface $53a^{viii}$ in the second interface $53b^{viii}$ are connected by a connection line $55^{viii}$. It is, thus, possible to control lighting condition as well as overall length size by means of specifying for individual subsequent ranges of angles of emission individual second interfaces $53a^{viii}$, $53b^{viii}$.

Further, the second interfaces 3, 3', 3'', 3''', $3^{iv}$, $3^{v}$, $3^{vi}$, $3^{vii}$, $53a^{viii}$, $53b^{viii}$ can be controlled by varying the first interface 15, 15', 15'', 15''', $15^{iv}$ $15^{v}$, $15^{vi}$, $15^{vii}$ from line to any freeform surface, for example described by means of a polynomial function.

Figure 10A:
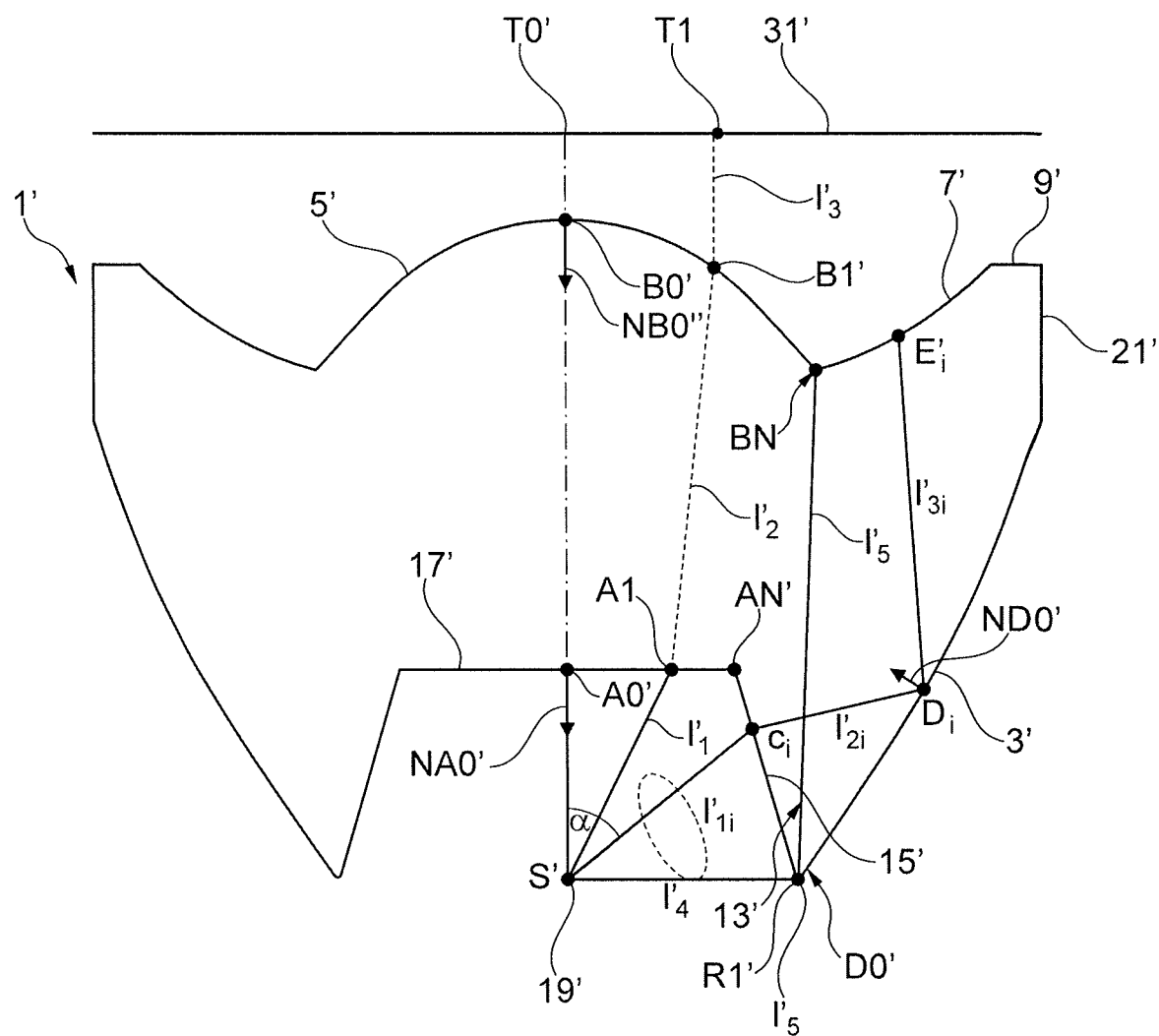
FIG. 10a is a cross-sectional view of an example of a 3D TIR lens.

The cross-section of the TIR lens 1' shown in FIG. 10a including a single second interface 3' is fabricated according to a method including the step that for each single point of the second interface the angle of reflection at this point is described by a polynomial function which is dependent on the angle of emission for the particular light ray impinging on the particular point of the second interface. The variation of the angle of reflection may be bounded by some lower and upper limit value which limits are dependent on the overall lens size, illumination length and input aperture. Via the normal vector at the particular point which is defined by the law of reflection the appropriate shape of the interface 3' at the particular point is defined and the particular point of second interface 3' can be calculated e.g. by means of the tangent approximation method. Therefore, the first interface 15' has been defined previously in order to incorporate the refraction of the light ray. The interface 15' in FIG. 10a is a straight line.

However, the mapping from the radiation pattern of the light emitting source 19' to the target area 31' may depend on the distribution pattern. Thus, the choice of the order of the polynomial function may depend on the radiation pattern of the light emitting source 19. If the radiation pattern of the light emitting source 19' is constant, for angles of emission in the range from alpha to 90° for uniform illumination, a zero-order polynomial function is best. If the radiation pattern of the light emitting source 19' is changing linear, for angles of emission in the range from alpha to 90° for uniform illumination, a first-order polynomial function is best.

In other cases after fitting the first-order polynomial function a correction can be identified and correspondingly the order of the polynomial function can be increased continuously to achieve the required light distribution for the particular light emitting source 19. Any random radiation pattern of a light emitting source 19 can be related by means of the corresponding polynomial function to achieve the required lighting distribution. A corresponding polynomial function may need to be developed to define the angle of reflection at the second interface 3' for specific angles of emission of light rays emitted by the light emitting source 19. However, the polynomial function can be controlled also or in addition by other design parameters rather than the angle of emission.

Once the second interface 3' is obtained, the third interface 7' is calculated based on the further design needs by means of the cartesian oval design method, cartesian optical method, tangent approximation method, partial differential equation based method and/or the simultaneous multiple surface method. The shape of the third interface 7' determines the collimation of the light rays and/or depends on the target illumination requirements and/or the direction of the light rays after leaving the TIR lens. In order to optimize the performance of the TIR lens second interface 3' and third interface 7' are dependent on each other. Hence, the third interface 7' controls the light rays coming from the second interface 3' to redistribute the light rays as per the design intent.

For the final cross-sectional lens shape, interfaces 5' and 17' are calculated, respectively, using the cartesian oval method and the tangent approximation method.

Further, the cross-section of the TIR lens shown in FIG. 10a shows elements 9' and 21 which are kept to join the lens with some base frame of other lenses to create a lens array without affecting the lighting distribution of the single lenses. Element 9' is kept flat.

The steps for obtaining a cross-sectional TIR lens are described in FIG. 10a in detail. There are multiple methods to design a lens profile, inter alia the cartesian optical method, the tangent approximation method, the partial differential equitation based method, the simultaneous multiple surface (SMS) method.

A method for producing a TIR lens preferably uses an hybrid method of the cartesian optical method, the tangent approximation method and the partial differential based method with an extra condition. This extra condition may be governed through the relationship between the angle of reflection at the second interface and the angle of emission under which the light ray emitted by the light source is radiated with respect to optical axis O.

To design any lens the total area of illumination may be distributed into two parts:
1. The direct lens area (first part A), where any light ray is refracted twice from the light emitting source until reaching at the target surface. This target surface may be the input for another lens.
2. The TIR lens area (second part B) where light is first refracted at the input area and then reflects with TIR phenomena and then again gets refracted from outer area before hitting the target surface.

For designing the first part A of the TIR lens, a hybrid design method may be used from tangent approximation method as well as cartesian oval design method. The target area 31' may be fixed, hence, the optical path length is chosen constant to find a required point using cartesian overall method.

First, the initial condition is given by choosing initial points A0' and B0' on the initial interfaces 17' and 5', respectively, and the target point T0', corresponding to the light ray emitted by the light emitting source 19' passing through A0' and B0' along with the appropriate normal vectors, NA0' and NB0', respectively, at the corresponding points.

If the distance between the two points P1, P2 is defined as [P1, P2] then the optical path length may be calculated as $$L=[S,A0']+n*[A0',B0']+[B0',T0']$$

where n is the refractive index. To calculate the next points of interface 17' the tangent approximation method is used while for obtaining the next points of the interface 5' the cartesian oval method is used.

The point A1' of interface 17' may be obtained by taking the next source points and considering the continuity from A0' to A1'. So with help of the normal vector at point A0', NA0', the point A0', the position of the light emitting source

19' as well as the appropriate light ray 11' (the next input ray from source), point A1', which is the next point of interface 17', may be calculated.

To refract the light ray from A1' to T1', where T1' is the next target point based on the design considerations, and for lambertian source and uniform illumination, T1'=TargetWidth*sin(phi)/sin(alpha) where TargetWidth is the total uniform length of the target area 31' to be illuminated by the light emitting source 19' considering asymmetric lens, phi is the incident angle of light ray $1_1'$ coming from the light emitting source 19' with respect to the optical axis O and alpha is the maximum incident angle to obtain the interface 17'.

Another condition of collimation gives the direction of the light ray after getting refracted from point B1' to the parallel to the optical axis O'.

By using the refractive index n, point A1', point T1', the light ray $1_3'$ after refraction at point B1' and the trimmed optical path length from A1' to T1' (i.e., L-[S', A1']) point B1' at interface 5' can be obtained.

By using light ray $1_1'$ and $1_2'$, the normal vector at point A1' may be calculated which will be use as one of the inputs to calculate the next point of interface 17', A2'.

Figure 10B:
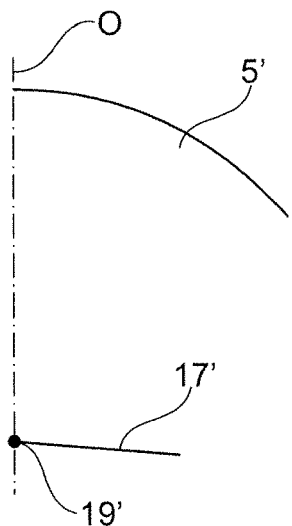

This process is continued until the maximum value of the angle of emission, alpha, is reached. Hence, these steps give the points Ai' and Bi'. And with the help of those the spline/B-Splines/NURBS for the interfaces 17' and 5', respectively, are obtained which are shown in FIG. 10b in a close up from FIG. 10a.

For designing the second part B of the TIR lens three interfaces are to be calculated, i.e. the first interface 15' for refraction, the second interface 3' for reflection and the third interface 7' for refraction compared to two interfaces for the first part A. In order to govern the freeform surface of the first interface 15', various conditions can be provided which are compatible to the design need. For the cross-section of the TIR lens from FIG. 10a, the first interface 15' is kept as linear line which can be fixed based on the draft angle requirements considering the manufacturing of the lens.

Figure 10C:
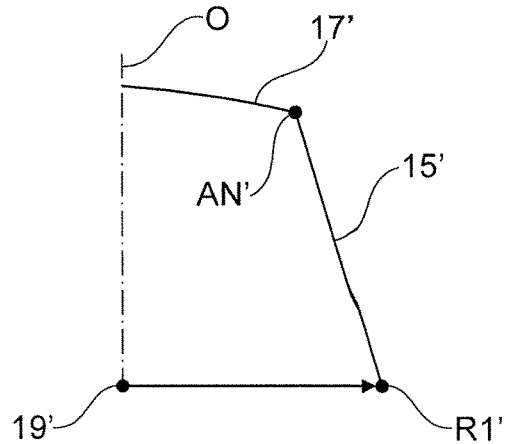

As shown in FIG. 10c in a close up from FIG. 10a, the first interface 15' is considered as line which is controlled by the perpendicular distance between the endpoint R1' of the first interface 15' and the optical axis O and the overall depth of the influx cavity, whereby the influx cavity is the hole in the lens to place a light emitting source such as an LED or the portion where light flux is fed to the lens. It can also be defined based on the draft angle requirements for the manufacturing feasibility.

Figure 10D:
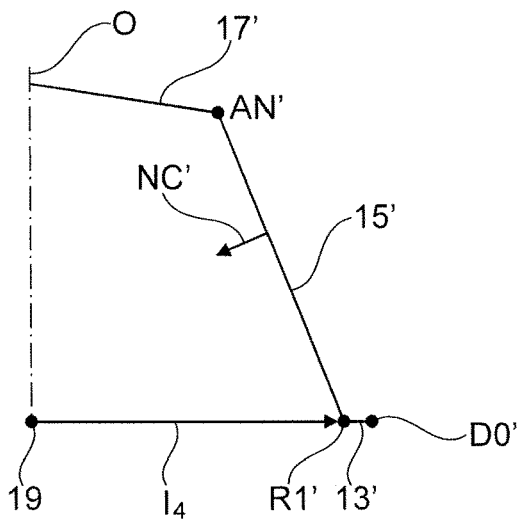

As shown in FIG. 10d in a close up from FIG. 10a by using the points AN' and R1' the normal vector/normal direction NC' of the first interface 15' is obtained. At the pole, i.e. for an angle of emission of 90°, the input light ray 14' emitted by the light emitted source 19' is considered which is refracted by the first interface 15'. Once passed through the edge 13' of length e, the direction RC0' of said edge may be obtained using the law of refraction. The initial point D0' of the second interface 3' may be obtained starting from endpoint R1' of the first interface 15' by using vector calculations, D0'=R1'+RC0'*e.

In order to obtain the second interface 3' and the third interface 7', an extra condition for a relationship between the angle of emission of the light ray emitted by the light emitting source 19' and the angle of reflection of the reflected light ray at the second interface 3' is provided. This extra condition can give more design freedom to construct family of shapes which can control the overall lighting distribution and/or the lens size.

In this example, the extra condition may be a generic polynomial relationship between both values where the coefficients of the polynomial function are constants defining the polynomial shape.

For example, a linear relationship between the angle of emission of the light ray emitted by the light emitting source 19' and the angle of reflection of the reflected light ray at the second interface 3 can be considered, Angle of reflection=*K*0'+*K*1'*angle of emission with K0' and K1' being coefficients of the polynomial function.

To obtain values of K0' and K1' various design constraints may be used. One equation is achieved by assuming that for an angle of emission of 90° the light ray $1_4'$ after reflection passes through the end point BE' of interface 5'. Another equation is obtained by imposing the maximum angle of reflection at an angle of emission of alpha while obtaining interface 5'.

Figure 10E:
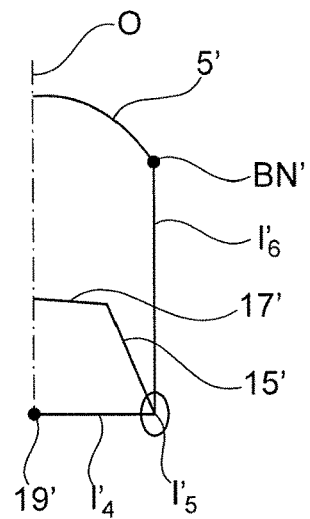
Figure 10F:
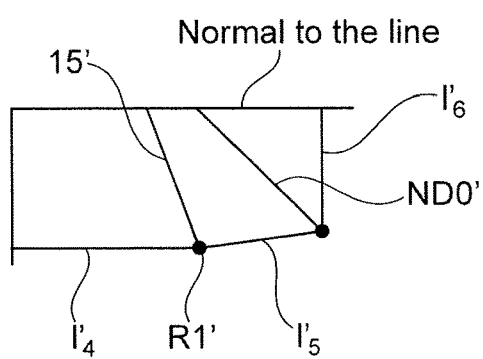
FIG. 10f is a diagram illustrating an example of close up of parts from FIG. 10e.

By using these two equations, for example, a relationship between the angle of emission of the light ray emitted by the light emitting source 19' and the angle of reflection of the reflected light ray at the second interface 3' can be obtained which can provide the corresponding points of the second interface 3'. These points of the second interface 3' are obtained as follows:

1. Obtain a relationship between the angle of emission of the light ray emitted by the light emitting source 19' and the angle of reflection of the reflected light ray at the second interface 3' as mentioned above.
2. Divide the light cone created by light rays emitted from the light emitting source 19' within a range of angles of emission between alpha and 90° in N equal parts and calculate dPHI=(90°-alpha)/N.
3. Set the angle of emission to 90°.
4. As shown in FIG. 10e in a close up from FIG. 10a or in more detail in FIG. 10f as a close up from FIG. 10e the light ray $1_4'$ coming from the light emitting source 19' is refracted at point R1' of the first interface 15' as light ray $1_5'$.
5. Based on the relationship obtained at step 1 the angle of reflection is calculated.
6. By using the angle of reflection the reflected light ray vector $1_6'$ is calculated.
7. Using the light ray vector $1_5'$ and $1_6'$ for calculating the normal vector ND0' at the second interface 3'.
8. Set i=1
9. Decrease the angle under which a light ray is emitted by the light emitting source 19 by dPHI.
10. calculate light ray $1_{1i}'$ as shown in FIG. 10a
11. calculate light ray $1_{2i}'$ as shown in FIG. 10a
12. Calculate point Ci on first interface 15' which is the point where the light ray $1_{1i}'$ intersects the first interface 15'.
13. Calculate point Di' on the second interface 3' by means of the tangent approximation method with help of Ci, $1_{2i}'$, D(i-1), ND(i-1), where D(i-1) and ND(i-1) are, respectively, previously calculated point and normal.
14. Calculate $1_{3i}'$ using the polynomial function
15. Calculate NDI' using $1_{3i}'$ and $1_{2i}'$
16. Increase i by one and repeat step 9 to 16 until the angle of emission reaches the value of alpha.

Similarly with separate polynomial functions, with different design constraints, a relationship between the angle of emission of the light ray emitted by the light emitting source 19' and the angle of reflection of the reflected light ray at the second interface 3' can be developed and used to calculate the second interface 3'.

Once the second interface 3' is obtained the third interface 7' is obtained based on the further design needs, i.e. collimation requirements. Cartesian oval design method or any other design method described above can be used to calculate the third interface 7'.

The third interface 7' can be obtained for collimation requirements using cartesian oval design method as follows:
1. Obtain the optical path length $L_1'=R_1'+(e+[D0,BN])*n+[BN,TN]$
2. Set E0=AN', where AN' is last point calculated of Curve A.
3. For Ei' calculate the differential path length $L_1'=L_1'-([S,Ci]+n*[Ci, Di])$
4. Use $T_N'+T_i'$ as target point where $T_N'$ is the point for light rays passing through AN' while $T_i'$ is the point corresponding to the area illuminated using the flux coming from TIR lens due to the second part B of the TIR lens caused by $1_{1i}'$ which depends on the uniform illumination requirements.
5. The light ray after refraction by the third interface 7' should be collimated
6. By using the points TN+Ti, an axis parallel to the optical axis O, Di and L1' the points Ei' of the third interface 7' can be calculated.
7. If the requirements are not to collimate the light beam, the same can also be obtained by defining the proper TN+Ti and use the $1_{3i}'$ The third interface 7' can be obtained for collimation requirements without uniformity considerations using tangent approximation method as follows:
1. The dimension dl of the connection element (9a, 9b, 9c in FIG. 8) of the lens is defined by the design need and manufacturing feasibility
2. Set E0=DN+13N*dl
3. For collimation application, the light rays will be collimated and parallel to the optical axis O after refraction from the third interface 7', hence obtain corresponding normal NE0 for the same.
4. Use NE0, E0, D(N−1), 13(N−1) to calculate E1
5. Calculate NE1
6. Repeat until the D0 is not reached
7. The third interface 7' and the interface 5' are joined by a line. Or the third interface 7' and the interface 5' are joined considering the tangent condition on the third interface 7' and the interface 5'.

Figure 11A:
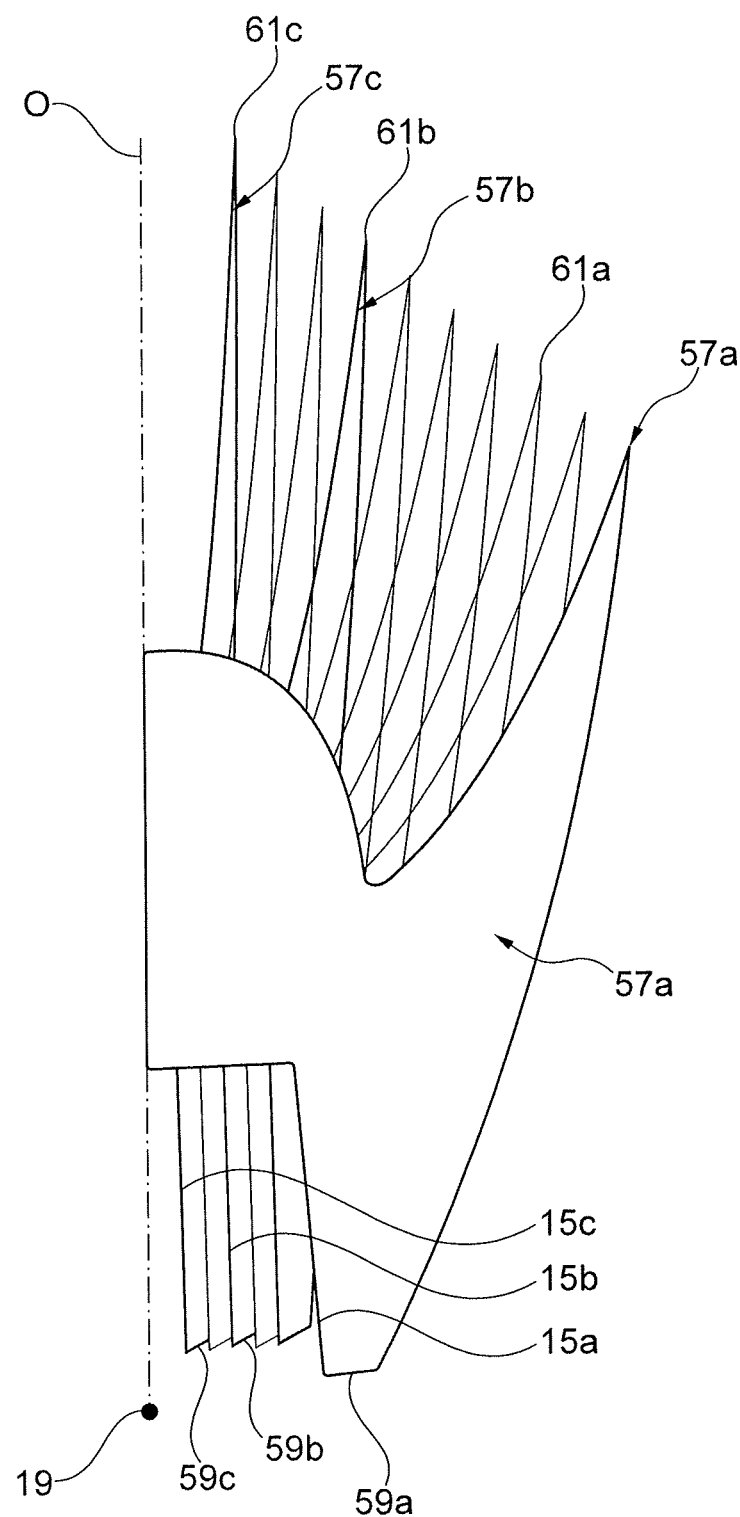
FIG. 11a is a perspective view of an example of multiple cross-sections of a 3D TIR lens at different angles of rotation.

The method may further include steps for obtaining a rectangular 3D TIR lens from the 2D cross-sections of a TIR lens shown in FIG. 10a obtained, as described previously. For this purpose, numerous 2D cross-sections of a TIR lens 57a, 57b, 57c as shown in FIG. 11a are calculated for every angle of rotation about the optical axis O. For 2D cross-section of a TIR lens 57a, 57b, 57c calculations are carried out for an individual consideration of the end point 59a, 59b, 59c of the first interface 15a, 15b, 15c (i.e. point R1 in FIG. 10a) as well as the length of the element 61a, 61b, 61c. This means that the end point of the first interface as well as the plane area adjacent to the third interface are functions of the angle of rotation while the other parts of the 2D cross-section of the TIR lens depend at most indirect on the angle of rotation as their calculations are based on said two values. Hence, various 2D cross-sections of a TIR lens 57a, 57b, 57c are generated by keeping all the variables same and changing the internal distance of the lens from the center denoted by R1 and the element 9 in FIG. 10a.

For example, the perpendicular distance of the end point of the first interface from the optical axis O may be given by distance at angle of rotation=distance_initial*sec (angle of rotation)

and the length of the element 9', 61a, 61b, 61c may be calculated by length at angle of rotation=length_initial*sec(angle of rotation)

wherein distance_initial and length_initial are initial values of, respectively, the distance and the length and the trigonometric function $\sec(\bullet)=1/\cos(\bullet)$ is used.

Figure 11B:
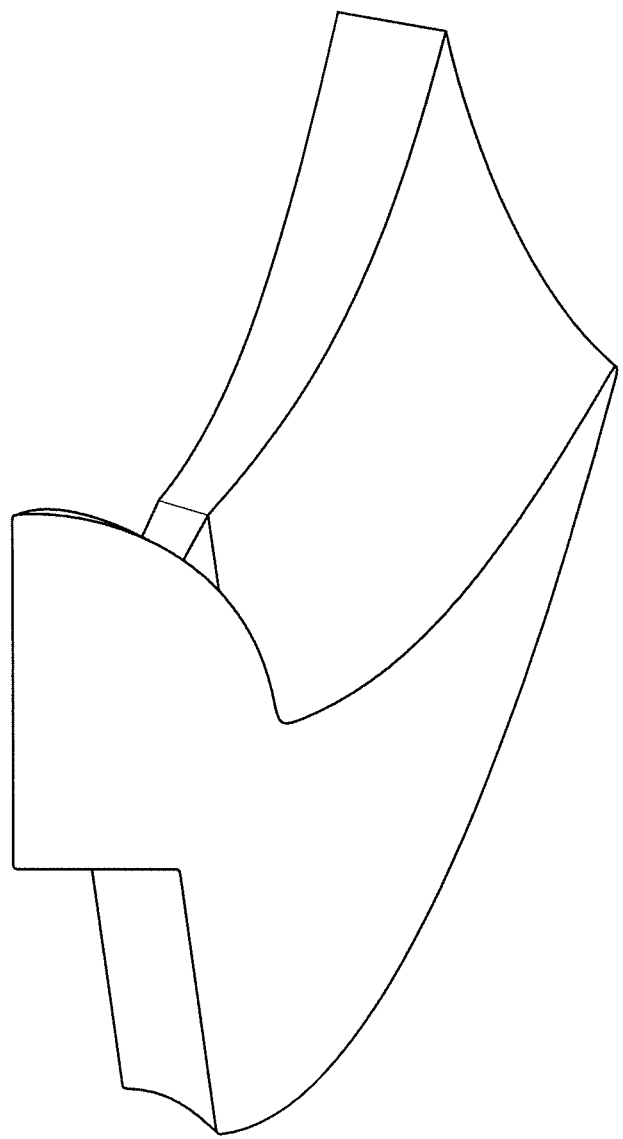
FIG. 11b is a diagram illustrating an example of a $\frac{1}{8}^{th}$ segment of a 3D TIR lens body.

Finally, by joining all 2D cross-sections of the TIR a new 3D TIR lens or freeform lens is obtained. FIG. 11b shows $\frac{1}{8}^{th}$ of the entire 3D TIR lens which is the symmetrical portion of the lens. When creating the 3D TIR lens at the corner at 45° the symmetry of the $\frac{1}{8}^{th}$ lens can be taken to create the rest part of the lens. In FIG. 11b to keep continuity, the lens may be rotated after 40° till 5°. It can be translated to any degrees and rotated after that to get the $\frac{1}{8}^{th}$ portion of the 3D TIR lens.

One example benefit of this method for obtaining a 3D TIR lens and of the 3D TIR lens is to provide a central portion as circular while the outer periphery is rectangular. This has the benefit that mounting of the produced lens can be simplified.

The concept of achieving a rectangular lens may be applied to any polygon lens with extrapolation of the new design parameter of R1 and the length of the element 9', 61a, 61b, 61c with respect to the new length to be illuminated at the particular angle and base target length at rotation angle of zero.

The method may be applied to non-uniform, non-collimated lenses as well just to control the second interface 3, 3', 3'', 3''', $3^{iv}$, $3^v$, $3^{vi}$, $3^{vii}$ to redirect the light for various angles of emission and then design the third interface 7, 7', 7'', 7''' to achieve the desired function.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

REFERENCE SIGNS

| | |
|---|---|
| 1, 1', 1'', 1''', $1^{iv}$, $1^v$, $1^{vi}$, $1^{vii}$, $1^{viii}$, $1^{(I)}$, $1^{(II)}$, $1^{(III)}$, $1^{(IV)}$ | lens |
| 3, 3', 3'', 3''', $3^{iv}$, $3^v$, $3^{vi}$, $3^{vii}$ | interface |
| 5, 5', 5'' | interface |
| 7, 7', 7'', 7''' | interface |
| 9, 9', 9a, 9b, 9c | connection element |
| 11, 11', 11''' | recess |
| 13, 13' | connection element |
| 15, 15', 15'', 15''', $15^{iv}$, $15^v$, $15^{vi}$, $15^{vii}$, $15^{viii}$, 15a, 15b, 15c | interface |

| | |
|---|---|
| 17, 17', 17" | interface |
| 19, 19', 19", 19''', 19$^{iv}$, 19$^v$, 19$^{vi}$, 19$^{vii}$, 19$^{viii}$ | light emitting source |
| 21', 21" | area |
| 23' | lens body volume |
| 25a', 25b', 25c' | light ray |
| 27' | lens body volume |
| 29a', 29b', 29c', 29d', 29d" | light ray |
| 31, 31", 31''', 31$^v$, 3$^{vi}$, 3$^{vii}$ | target area |
| 33 | TIR lens module |
| 35 | edge |
| 37 | cutting plane |
| 39a''', 39b''', 39c''' | light cone |
| 41a''', 41b''', 41c''' | area |
| 43a$^{iv}$, 43a$^v$, 43a$^{vi}$, 43a$^{vii}$, 43b$^{iv}$, 43b$^v$, 43b$^{vi}$, 43b$^{vii}$ | angle of reflection |
| 45a$^{iv}$, 45a$^v$, 45a$^{vi}$, 45a$^{vii}$, 45b$^{iv}$, 45b$^v$, 45b$^{vi}$, 45b$^{vii}$ | angle of emission |
| 47a, 47b, 47c, 47d | lens shape |
| 49a, 49b, 49c | lens shape |
| 51a$^{viii}$, 51b$^{viii}$ | light cone |
| 53a$^{viii}$, 53b$^{viii}$ | interface |
| 55$^{viii}$ | connection line |
| 57a, 57b, 57c | lens profile |
| 59a, 59b, 59c | corner point |
| 61a, 61b, 61c | edge |
| A, B | functional part |
| S | direction |
| O | optical axis |
| alpha, α | angle |
| NA0', NB0', Ei' | point |
| A0', A1', Ai' | point |
| B0', B1', Bi', BN' | point |
| T0' | target point |
| l1', l2', l3', l1i', l2i', l3i', l4', l5', l6' | light ray |
| S' | point |
| R1' | point |
| AN' | point |
| NC' | normal vector |
| D0' | normal vector |
| RC0' | normal vector |
| ND0' | normal vector |

What is claimed is:

1. A lens, comprising
at least one first interface acting as a refractive entrance surface for at least one light ray;
at least one second interface acting as a total inner reflective (TIR) surface for the light ray entering the lens through the first interface; and
at least one third interface acting as a refractive exit surface for the light ray reflected at the second interface,
wherein the second interface and the third interface are shaped such that at least two light rays having a diverging angle to each other and impinging under an arbitrary solid angle onto the first interface exit the lens in an area of the third interface substantial parallel to each other and in a common direction of space,
the third interface is shaped such that it has at least area by area a normal vector neither parallel nor perpendicular to the common direction of space,
the at least two light rays are substantial non-parallel to each other until exiting the third surface, and
the shape of at least one first section of the second interface is based on a polynomial first function, the first function determining the angle of reflection of the light ray reflected at the first section of the second interface depending on a first incident angle of the light ray on the first interface,
wherein, at a plurality of points of at least one second section of the second interface, the angle of reflection of the light ray impinging on the second interface with respect to the optical axis is defined by at least one polynomial second function depending on the first incident angle of the light ray on the first interface.

2. The lens of claim 1, wherein the light rays exit the lens under at least one first solid angle.

3. The lens of claim 1, further comprising, in a first plane perpendicular to the first solid angle, a substantially rectangular, quadratic, circular, elliptical or polynomial periphery, wherein at least one light emitting source which emit the light rays can be placed at a center of gravity of the first plane.

4. The lens of claim 1, further comprising at least one fourth interface which comprises at least one contact area for at least one mounting element for mounting the lens to at least one supporting structure.

5. The lens of claim 1, wherein at least one of
the lens further comprises at least area by area and in an area of at least one of the first interface, the second interface, and the third interface, at least one first medium comprising at least one of PMMA, PC and glass, and
at least one of the first interface, the second interface, and the third interface comprises a transition between a second medium comprising at least one of air and a low refractive index medium, and the second medium.

6. A method for producing the lens of claim 1, comprising defining, as a symmetry axis an optical axis of the lens, which passes through a first plane in which at least one propagation path of at least one light ray emitted by at least one light emitting source passes,
wherein the lens comprises:
at least one first interface acting as a refractive entrance surface for the light ray;
at least one second interface acting as a total inner reflective (TIR) surface for the light ray entering the lens through the first interface; and
at least one third interface acting as a refractive exit surface for the light ray reflected at the second interface, and
at a plurality of points of at least one first section of the second interface, the angle of reflection with respect to the optical axis of the light ray impinging on the second interface is based on at least one polynomial first function depending on at least one first variable,
wherein, at a plurality of points of at least one second section of the second interface, the angle of reflection of the light ray impinging on the second interface with respect to the optical axis is defined by at least one polynomial second function depending on at least the first variable,
wherein the first variable is determined depending on a first angle by which the angle of incidence under which the light ray impinges on the first interface with respect to the optical axis is defined.

7. The method according to claim 6, wherein the angle of reflection is determined for at least one value which exceeds at least one first limit of the first value or for at least one value which falls below of at least one second limit of the first value.

8. The method according to claim 6, wherein a plurality of second functions are determined for a plurality of second sections including for ten second sections.

9. The method according to claim 6, wherein the first interface is defined, at least area by area including an area by area course in the first plane, by a polynomial third function.

10. The method according to claim 6, wherein at least one of the first function, the second function, and the third function is determined by at least one polynomial function of order one, two, three, five, six, seven, eight, nine, or ten.

11. The method according to claim 6, wherein a form of the third interface is calculated at least area by area including an area by area course in the first plane, by a cartesian oval method, tangent approximation method, partial differential equation based method, or other design calculation method.

12. The method according to claim 6, wherein a form of at least one of the first interface, the second interface, and the third interface is determined for a plurality of first planes arranged under different second angles relatively to the symmetry axis or the optical axis.

13. The method according to claim 12, wherein at least one of the first function, the second function, and the third function is determined depending on the second angle, and at least one of the first function, the second function, and the third function comprise an additional term dependent on the second angle.

* * * * *